(12) United States Patent
Hsiao

(10) Patent No.: US 10,403,338 B2
(45) Date of Patent: Sep. 3, 2019

(54) LOW POWER MEMORY DEVICE WITH COLUMN AND ROW LINE SWITCHES FOR SPECIFIC MEMORY CELLS

(71) Applicant: Chih-Cheng Hsiao, Taichung (TW)

(72) Inventor: Chih-Cheng Hsiao, Taichung (TW)

( * ) Notice: Subject to any disclaimer, the term of this patent is extended or adjusted under 35 U.S.C. 154(b) by 0 days.

(21) Appl. No.: 15/950,183

(22) Filed: Apr. 11, 2018

(65) Prior Publication Data

US 2018/0233182 A1 Aug. 16, 2018

Related U.S. Application Data

(63) Continuation-in-part of application No. 14/840,037, filed on Aug. 30, 2015, now abandoned.

(51) Int. Cl.
| | |
|---|---|
| *G11C 7/12* | (2006.01) |
| *G11C 7/22* | (2006.01) |
| *G11C 16/26* | (2006.01) |
| *G11C 16/24* | (2006.01) |
| *G06F 12/06* | (2006.01) |
| *G11C 5/14* | (2006.01) |
| *G11C 7/18* | (2006.01) |
| *G11C 8/14* | (2006.01) |

(Continued)

(52) U.S. Cl.
CPC ............ *G11C 7/12* (2013.01); *G06F 12/0646* (2013.01); *G11C 5/147* (2013.01); *G11C 7/1012* (2013.01); *G11C 7/18* (2013.01); *G11C 7/22* (2013.01); *G11C 8/12* (2013.01); *G11C 8/14* (2013.01); *G11C 11/413* (2013.01); *G11C 16/24* (2013.01); *G11C 16/26* (2013.01); *G11C 2207/005* (2013.01)

(58) Field of Classification Search
CPC ........... G11C 7/1012; G11C 8/12; G11C 8/14; G11C 7/18; G11C 11/413; G11C 5/147; G11C 16/24; G11C 7/22; G11C 16/26; G11C 2207/005; G06F 12/0646
See application file for complete search history.

(56) References Cited

U.S. PATENT DOCUMENTS 6,034,911 A * 3/2000 Aimoto ................... G11C 8/12
 365/230.03
6,058,065 A 5/2000 Lattimore
(Continued)

FOREIGN PATENT DOCUMENTS

| CN | 104867517 A | 8/2015 |
|---|---|---|
| JP | 2007-273007 A | 10/2007 |

(Continued)

*Primary Examiner* — Jerome Leboeuf
(74) *Attorney, Agent, or Firm* — Winston Hsu

(57) ABSTRACT

A memory device includes a plurality of word lines elongated along a first direction, and at least one memory unit. The at least one memory unit includes a plurality of memory cells, at least one bit line, and at least one column word line. The plurality of memory cells are arranged along a second direction different from the first direction. The at least one bit line is elongated along the second direction, and configured to transmit data of a selected memory cell. The at least one column word line is elongated along the second direction, and configured to control electrical connections between the memory cells and the at least one bit line, wherein the selected memory cell is selected by a corresponding word line and the at least one column word line.

8 Claims, 26 Drawing Sheets

(51) Int. Cl.
*G11C 11/413* (2006.01)
*G11C 7/10* (2006.01)
*G11C 8/12* (2006.01)

(56) References Cited

U.S. PATENT DOCUMENTS

| | | | |
|---|---|---|---|
| 6,094,370 | A | 7/2000 | Takashima |
| 6,278,647 | B1 | 8/2001 | Saitoh |
| 6,842,377 | B2 | 1/2005 | Takano |
| 6,982,902 | B2 | 1/2006 | Gogl |
| 7,196,942 | B2 | 3/2007 | Khurana |
| 2003/0174570 | A1 | 9/2003 | Ooishi |
| 2005/0221561 | A1 | 10/2005 | Yamauchi |
| 2006/0170111 | A1 | 8/2006 | Isa |
| 2007/0008328 | A1 | 1/2007 | MacWilliams |
| 2009/0161437 | A1 | 6/2009 | Pyeon |
| 2010/0046267 | A1 | 2/2010 | Yan |
| 2010/0302831 | A1 | 12/2010 | Takeyama |
| 2011/0170351 | A1 | 7/2011 | Chen |
| 2011/0216602 | A1 | 9/2011 | Kim |
| 2011/0235448 | A1 | 9/2011 | Wu |
| 2013/0148415 | A1 | 6/2013 | Shu |
| 2014/0003114 | A1 | 1/2014 | Pellizzer |
| 2015/0131356 | A1 | 5/2015 | Kurokawa |
| 2015/0309743 | A1 | 10/2015 | Sohn |
| 2016/0034220 | A1 | 2/2016 | Hsiao |
| 2016/0260477 | A1 | 9/2016 | Kyung |

FOREIGN PATENT DOCUMENTS

| | | |
|---|---|---|
| JP | 2013-118023 A | 6/2013 |
| JP | 2014-78305 A | 5/2014 |
| WO | 2012081159 A1 | 6/2012 |

\* cited by examiner

LOW POWER MEMORY DEVICE WITH COLUMN AND ROW LINE SWITCHES FOR SPECIFIC MEMORY CELLS

CROSS REFERENCE TO RELATED APPLICATIONS

This is a continuation-in-part of Ser. No. 14/840,037, filed on 2015 Aug. 30, the contents of which are incorporated by reference.

BACKGROUND OF THE INVENTION

1. Field of the Invention

The present invention relates to a memory device, and more particularly, to a memory device with low power consumption.

2. Description of the Prior Art

Please refer to FIG. 1. FIG. 1 is a diagram showing a memory device of the prior art. As shown in FIG. 1, the memory device 100 comprises a plurality of memory cells MC, a plurality of word lines WL0-WL255, and a plurality of bit lines BL0-BL255. The memory cells MC are arranged in a matrix form. For example, the memory cells are arranged into a matrix having 256 rows and 256 columns. The word lines WL0-WL255 are elongated along a first direction A, and each of the word lines WL0-WL255 is configured to select a corresponding row of the memory cells MC for a read/write operation. The bit lines BL0-BL255 are elongated along a second direction B different from the first direction A, and each of the bit lines BL0-BL255 is configured to transmit data of a corresponding column of the memory cells MC.

Please refer to FIG. 2. FIG. 2 is a diagram showing a memory device 200 with a first bit line arrangement of the prior art. As shown in FIG. 2, the plurality of memory cells MC are divided into a predetermined number (such as 8) of memory blocks bk0-bk7, and each of the memory blocks bk0-bk7 comprises 32 columns of the memory cells MC. Moreover, in addition to the memory cells MC, the word lines WL0-WL255, and the bit lines (bit0_bk0 to bit31_bk7), the memory device 200 further comprises a plurality of multiplexers MUX0-MUX7. Each of the multiplexers MUX0-MUX7 is coupled to bit lines (bit0_bk0 to bit31_bk7) of 32 columns of the memory cells MC of a corresponding memory block bk0-bk7. For example, the multiplexer MUX0 is coupled to bit lines (bit0_bk0 to bit31_bk0) of 32 columns of the memory cells MC of the memory block bk0, the multiplexer MUX7 is coupled to bit lines (bit0_bk7 to bit31_bk7) of 32 columns of the memory cells MC of the memory block bk7, and so on.

Please refer to FIG. 3. FIG. 3 is a diagram showing a memory device 300 with a second bit line arrangement of the prior art. As shown in FIG. 3, in addition to the memory cells MC, the word lines WL0-WL255, and the bit lines (bit0_bk0 to bit31_bk7), the memory device 300 with the second bit line arrangement further comprises a plurality of multiplexers MUX0-MUX31. Moreover, the bit lines (bit0_bk0 to bit31_bk7) of each memory block bk0-bk7 are scattered sequentially. For example, the multiplexer MUX0 is coupled to bit lines (bit0_bk0 to bit0_bk7) of first columns of the memory cells of the memory blocks bk0-bk7, the multiplexer MUX31 is coupled to bit lines (bit31_bk0 to bit31_bk7) of 32th columns of the memory cells of the memory blocks bk0-bk7, and so on. Comparing with the first bit line arrangement of FIG. 2, the second bit line arrangement of FIG. 3 can simplify wiring.

In the memory devices 100, 200, 300 of the prior art, when one of the word lines WL0-WL255 selects a corresponding row of the memory cells MC, all the bit lines BL0-BL255 are coupled to corresponding selected memory cells for the read/write operation. However, during the read/write operation, some of the bit lines BL0-BL255 are not required to transmit data. The idle bit lines consume power during the read/write operation, such that the memory device 100 of the prior art has higher power consumption.

SUMMARY OF THE INVENTION

The present invention provides a memory device,

These and other objectives of the present invention will no doubt become obvious to those of ordinary skill in the art after reading the following detailed description of the preferred embodiment that is illustrated in the various figures and drawings.

DETAILED DESCRIPTION

Figure 1:
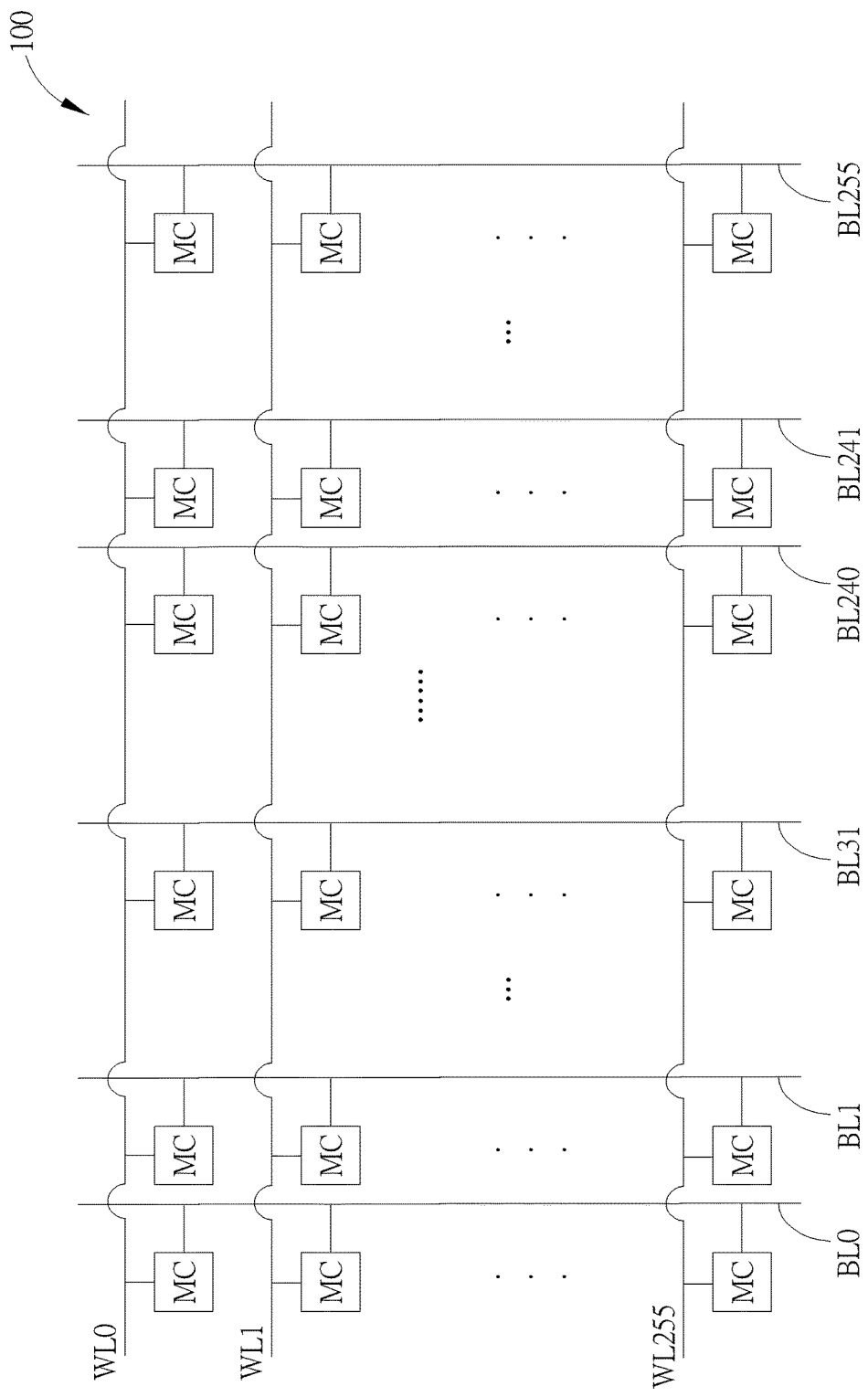
FIG. 1 is a diagram showing a memory device of the prior art.
Figure 2:
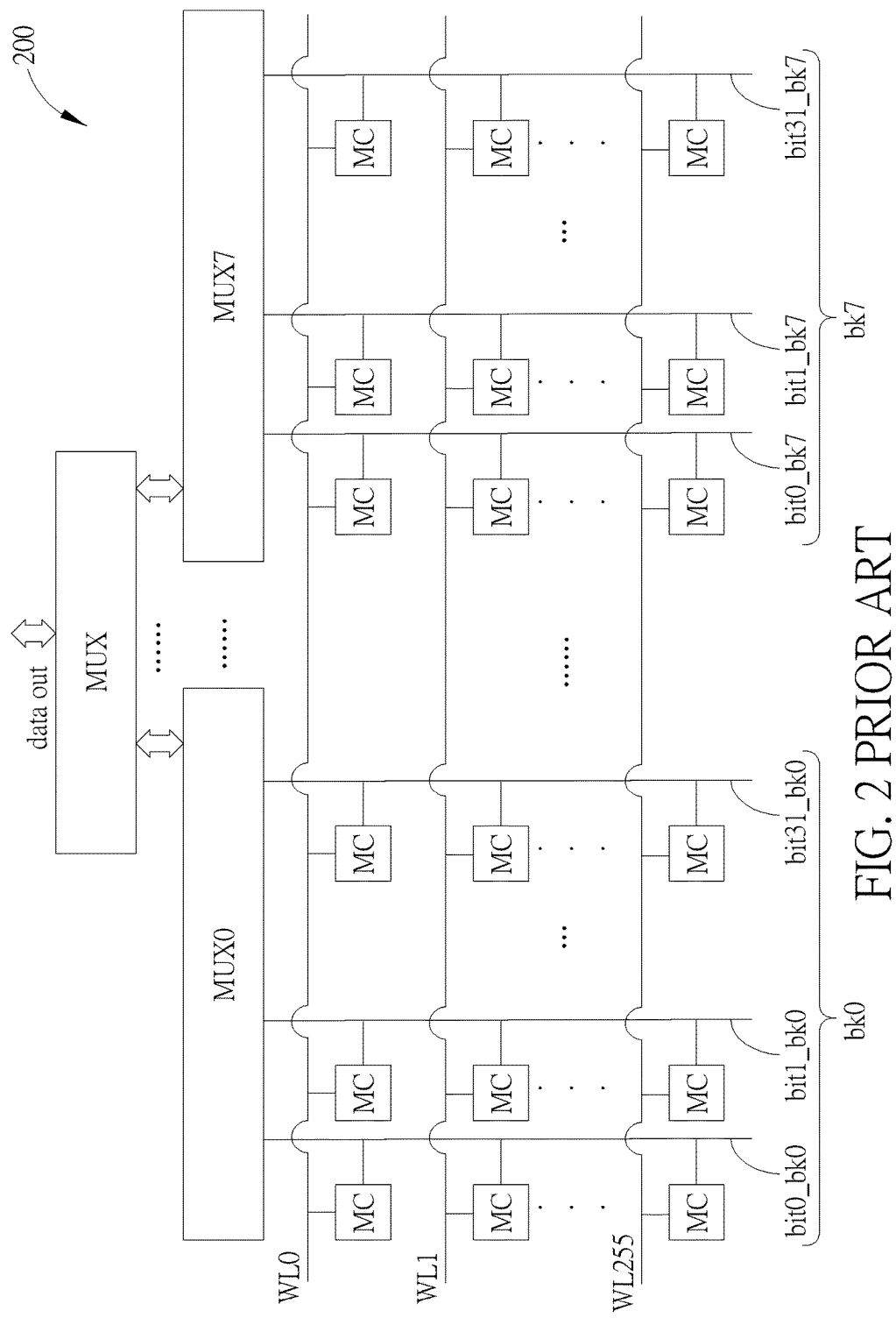
FIG. 2 is a diagram showing a memory device with a first bit line arrangement of the prior art.
Figure 4:
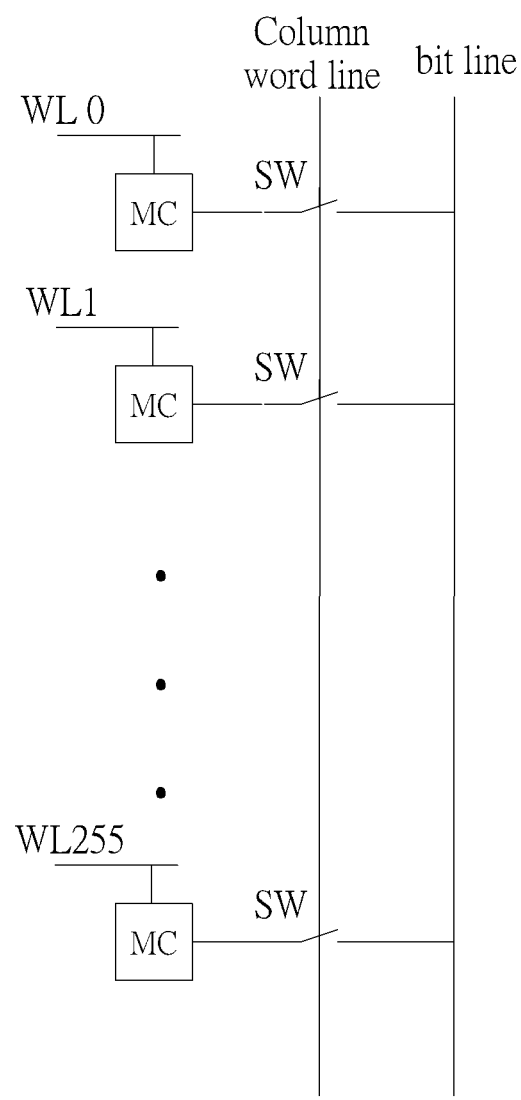
FIG. 4 is a diagram showing a memory unit with a first word line arrangement of the present invention.
Figure 5:
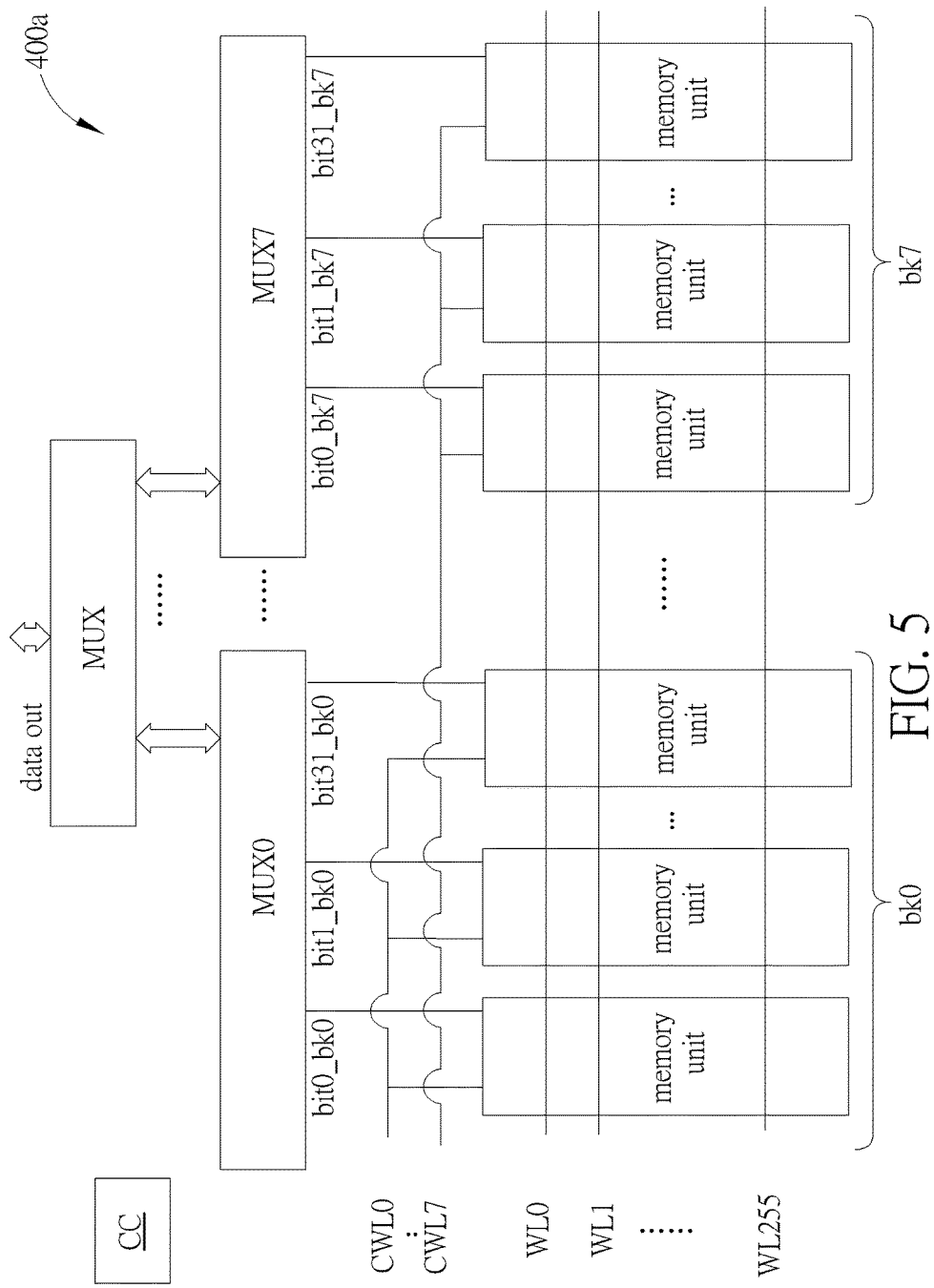
FIG. 5 is a diagram showing a memory device of the present invention with the first word line arrangement and the first bit line arrangement.

Please refer to FIG. 4 and FIG. 5 together. FIG. 4 is a diagram showing a memory unit with a first word line arrangement of the present invention. FIG. 5 is a diagram showing a memory device 400a of the present invention with the first word line arrangement and the first bit line arrangement. For ease of illustration, a column of the memory cells MC and related signal lines/switches are represented by a memory unit in FIG. 5. As shown in figures, arrangements of memory cells MC, word lines WL0-WL255, bit lines (bit0_bk0 to bit31_bk7) and multiplexers MUX0-MUX7 of the memory device 400a are similar to those of the memory device 200 of FIG. 2. The memory device 400a further comprises a plurality of column word lines CWL0-CWL7 elongated along the second direction B and a plurality of switches SW. Each of the switches SW has a control terminal coupled to a corresponding column word line CWL0-CWL7, a first terminal coupled to a single memory cell MC, and a second terminal coupled to a corresponding bit line (bit0_bk0 to bit31_bk7). Each of the column word lines CWL0-CWL7 is configured to control on/off states of the switches SW of a corresponding memory block bk0-bk7. For example, the column word line CWL0 is coupled to the control terminals of the 256 switches SW of each column of the memory cells MC of the memory block bk0, the column word line CWL7 is coupled to the control terminals of the 256 switches SW of each column of the memory cells MC of the memory block bk7, and so on. As such, each of the column word lines CWL0-CWL7 can control on/off states of all the switches SW of a corresponding memory block bk0-bk7 simultaneously, and the switches SW of different memory blocks bk0-bk7 can be controlled individually. In addition, the memory device 400a comprises a control circuit CC. The control circuit CC is coupled to the column word lines CWL0-CWL7 and configured to generate column word line signals CWL0-CWL7. Notably, notations CWL0-CWL7 are used to denote column word line signals and column word lines interchangeably.

According to the above arrangement, when one of the word lines WL0-WL255 selects a corresponding row of the memory cells MC for a read/write operation, the column word lines CWL0-CWL7 can be used to further select the memory cells MC of the specific memory block bk0-bk7 for the read/write operation. For example, when the column word line CWL0 delivers the column word line signal CWL0 to the control terminals of the switches SW of the memory block bk0, only the switches SW of the memory block bk0 are turned on to couple the memory cells MC of the memory block bk0 to the corresponding bit lines (bit0_bk0 to bit31_bk0), for allowing the corresponding bit lines (bit0_bk0 to bit31_bk0) to transmit data. On the other hand, other bit lines corresponding to the memory block bk1-bk7 are not driven to transmit data. Therefore, the power consumption of the memory device 400a can be reduced.

In addition, the memory cell MC may correspond to a plurality of bit lines. For example, when the memory cell is a memory cell of SRAM, the memory cell may be selected to couple to two bit lines. Accordingly, two or more column word lines can be arranged to control electrical connections between the memory cell and the two bit lines.

Figure 3:
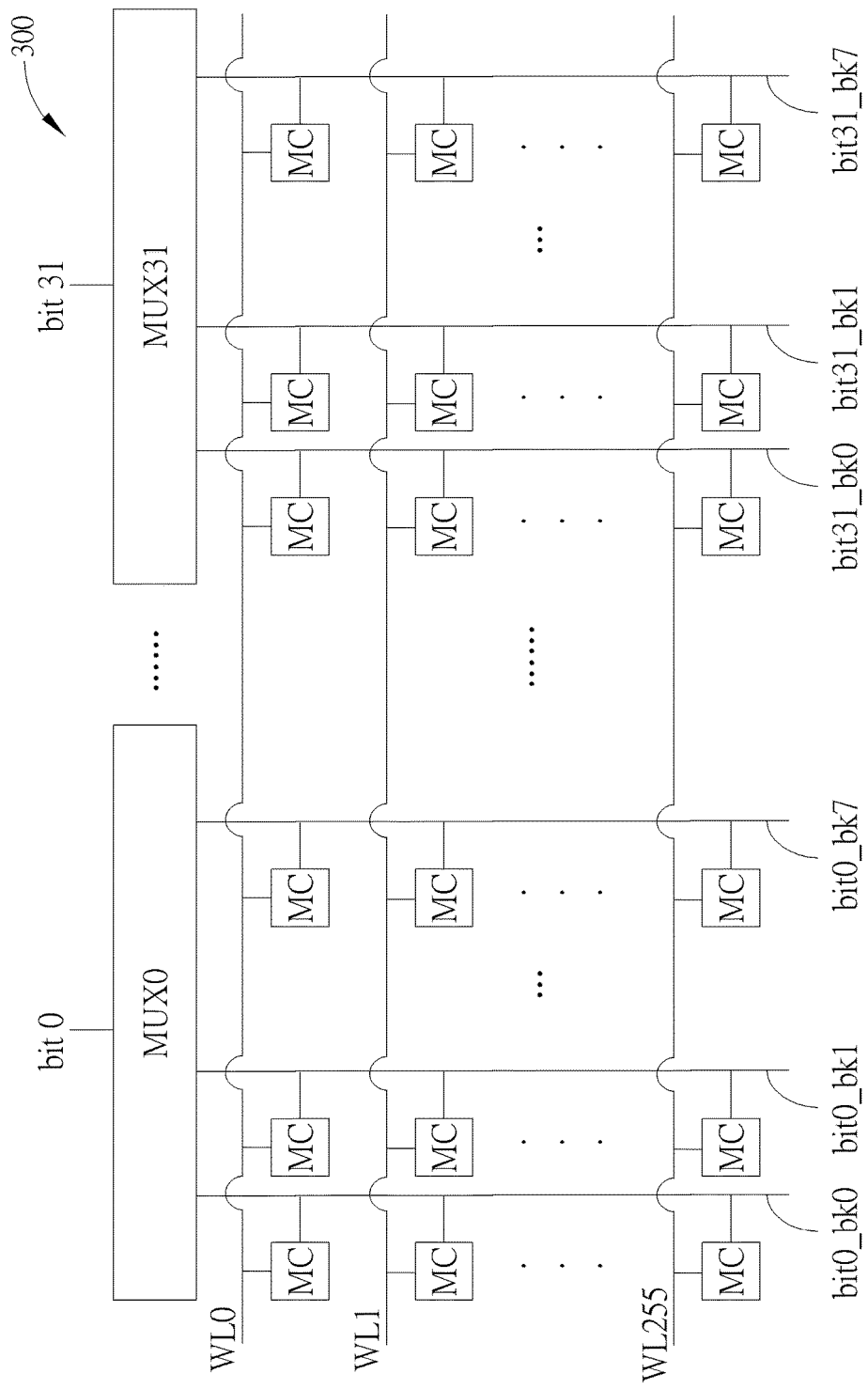
FIG. 3 is a diagram showing a memory device with a second bit line arrangement of the prior art.
Figure 6:
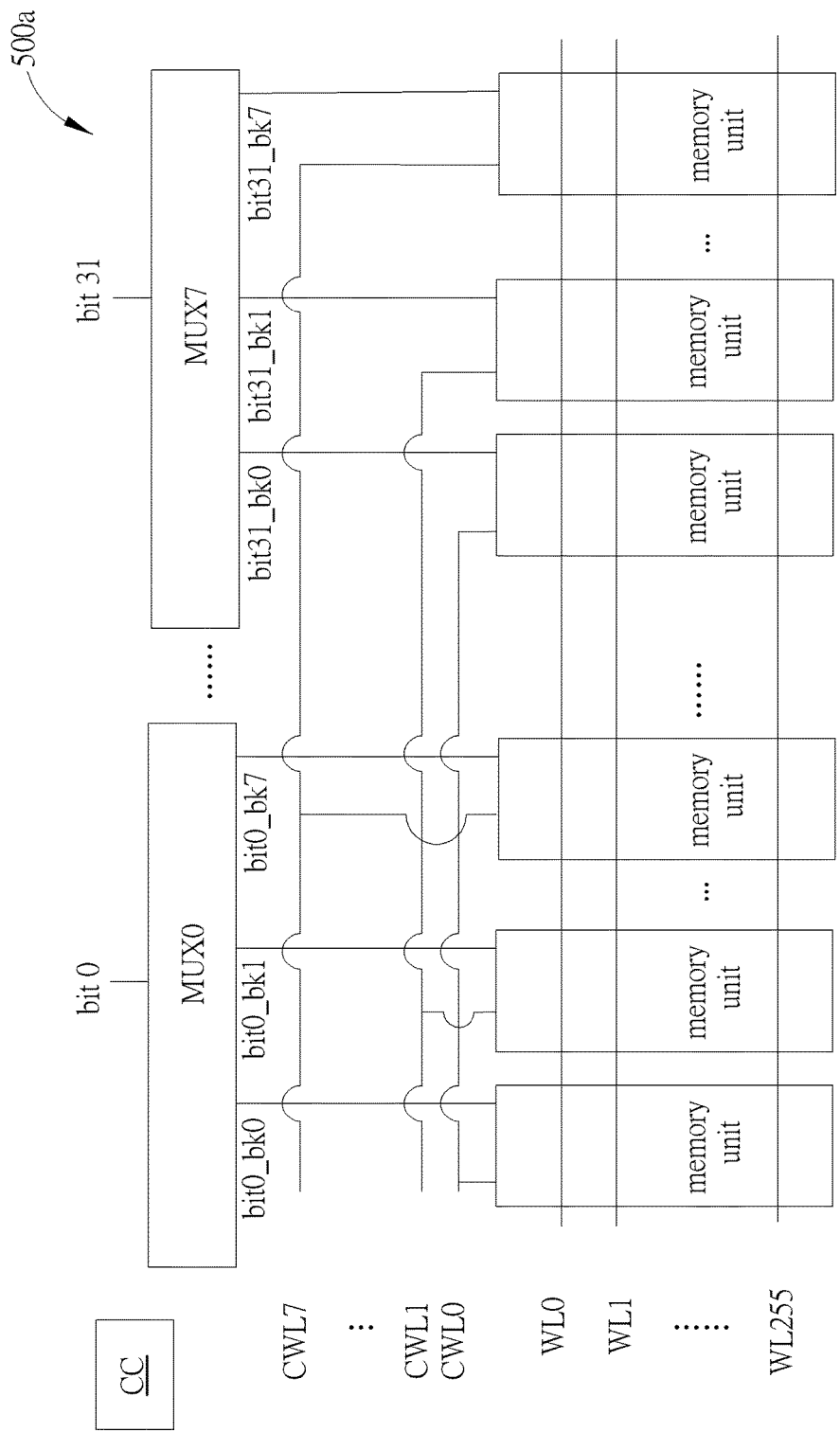
FIG. 6 is a diagram showing a memory device of the present invention with the first word line arrangement and the second bit line arrangement.

Please refer to FIG. 4 and FIG. 6 together. FIG. 6 is a diagram showing a memory device 500a of the present invention with the first word line arrangement and the second bit line arrangement. For ease of illustration, a column of the memory cells MC and related signal lines/switches are represented by a memory unit in FIG. 6. As shown in figures, arrangements of memory cells MC, word lines WL0-WL255, bit lines (bit0_bk0 to bit31_bk7) and multiplexers MUX0-MUX31 of the memory device 500a are similar to those of the memory device 300 of FIG. 3. Although the bit lines (bit0_bk0 to bit31_bk7) of each memory block bk0-bk7 are scattered sequentially, each of the column word lines CWL0-CWL7 is still configured to control on/off states of the switches SW of a corresponding memory block bk0-bk7. For example, the column word line CWL0 is coupled to the control terminals of the 256 switches SW of each column of the memory cells MC of the memory block bk0, the column word line CWL7 is coupled to the control terminals of the 256 switches SW of each column of the memory cells MC of the memory block bk7, and so on. As such, each of the column word lines CWL0-CWL7 can control on/off states of all the switches SW of a corresponding memory block bk0-bk7 simultaneously, and the switches SW of different memory blocks bk0-bk7 can be controlled individually. In addition, the memory device 500a also comprises the control circuit CC to generate the column word line signals CWL0-CWL7.

Similarly, when one of the word lines WL0-WL255 selects a corresponding row of the memory cells MC for the read/write operation, the column word lines CWL0-CWL7 can be used to further select the memory cells MC of the specific memory block bk0-bk7 for the read/write operation. For example, when the word line CWL0 transmits a control signal to the control terminals of the switches SW of the memory block bk0, only the switches SW of the memory block bk0 are turned on to couple the memory cells MC of the memory block bk0 to the corresponding bit lines (bit0_bk0 to bit31_bk0), for allowing the corresponding bit lines (bit0_bk0 to bit31_bk0) to transmit data. On the other hand, other bit lines corresponding to the memory block bk1-bk7 are not driven to transmit data. Therefore, the power consumption of the memory device 500a can be reduced.

Figure 7:
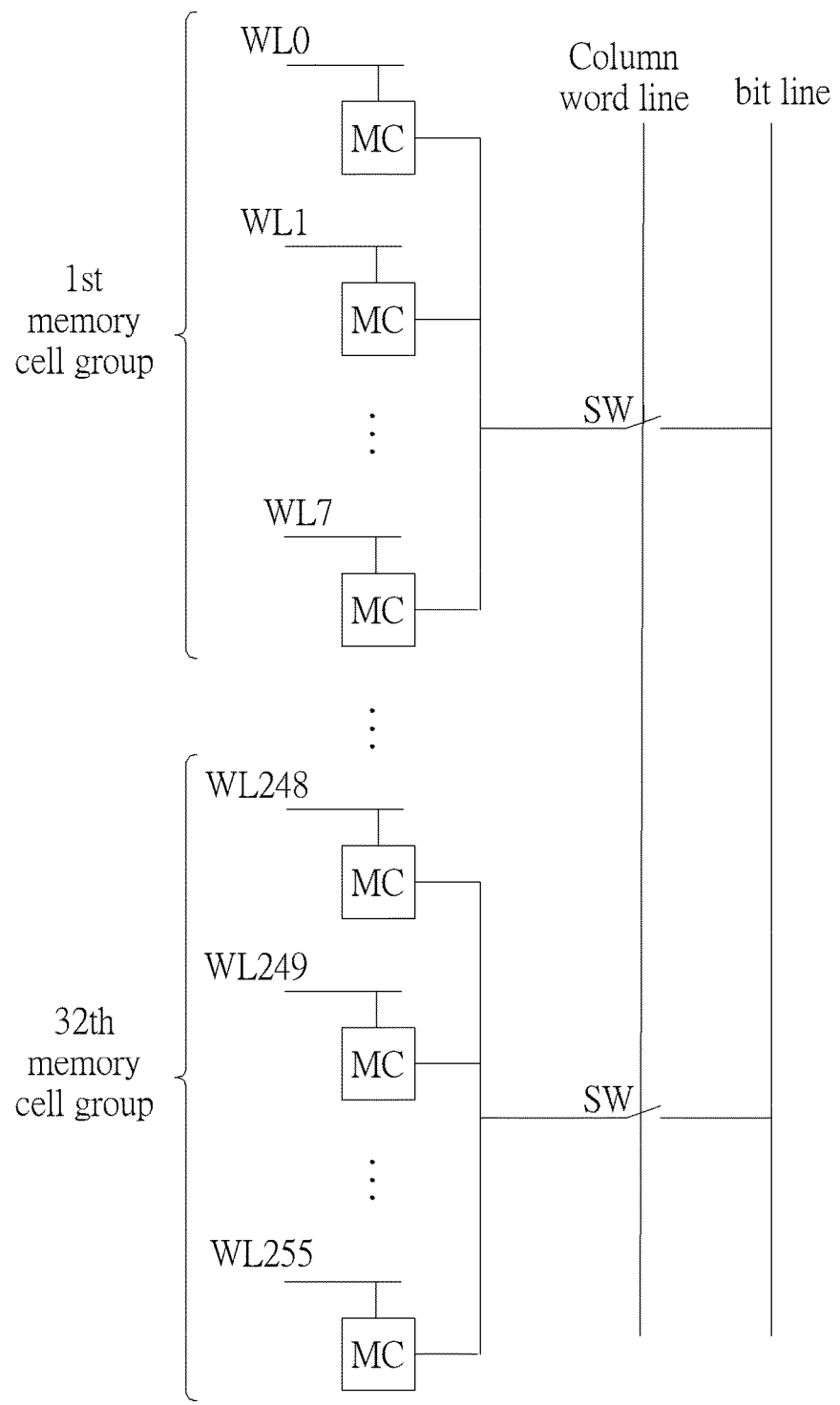
FIG. 7 is a diagram showing a memory unit with a first embodiment of a second word line arrangement of the present invention.

Please refer to FIG. 7. FIG. 7 is a diagram showing a memory unit with a first embodiment of a second word line arrangement of the present invention. As shown in FIG. 7, a column of the memory cells MC are divided into a predetermined number (such as 32) of memory cell groups, and each of the 32 memory cell groups comprises 8 memory cells. The switch SW is coupled between one of the 32 memory cell groups and a corresponding bit line. The column word line is configured to turn on/off 32 switches SW of each column of the memory cells MC of a corresponding memory block simultaneously.

The second word line arrangement of FIG. 7 is applicable to the memory device 400a of FIG. 5 and the memory device 500a of FIG. 6. For example, the column word line CWL0 is coupled to the control terminals of the 32 switches SW of each column of the memory cells MC of the memory block bk0, the column word line CWL7 is coupled to the control terminals of the 32 switches SW of each column of the memory cells MC of the memory block bk7, and so on. As such, each of the column word lines CWL0-CWL7 can control on/off states of all the switches SW of a corresponding memory block bk0-bk7 simultaneously.

Figure 8:
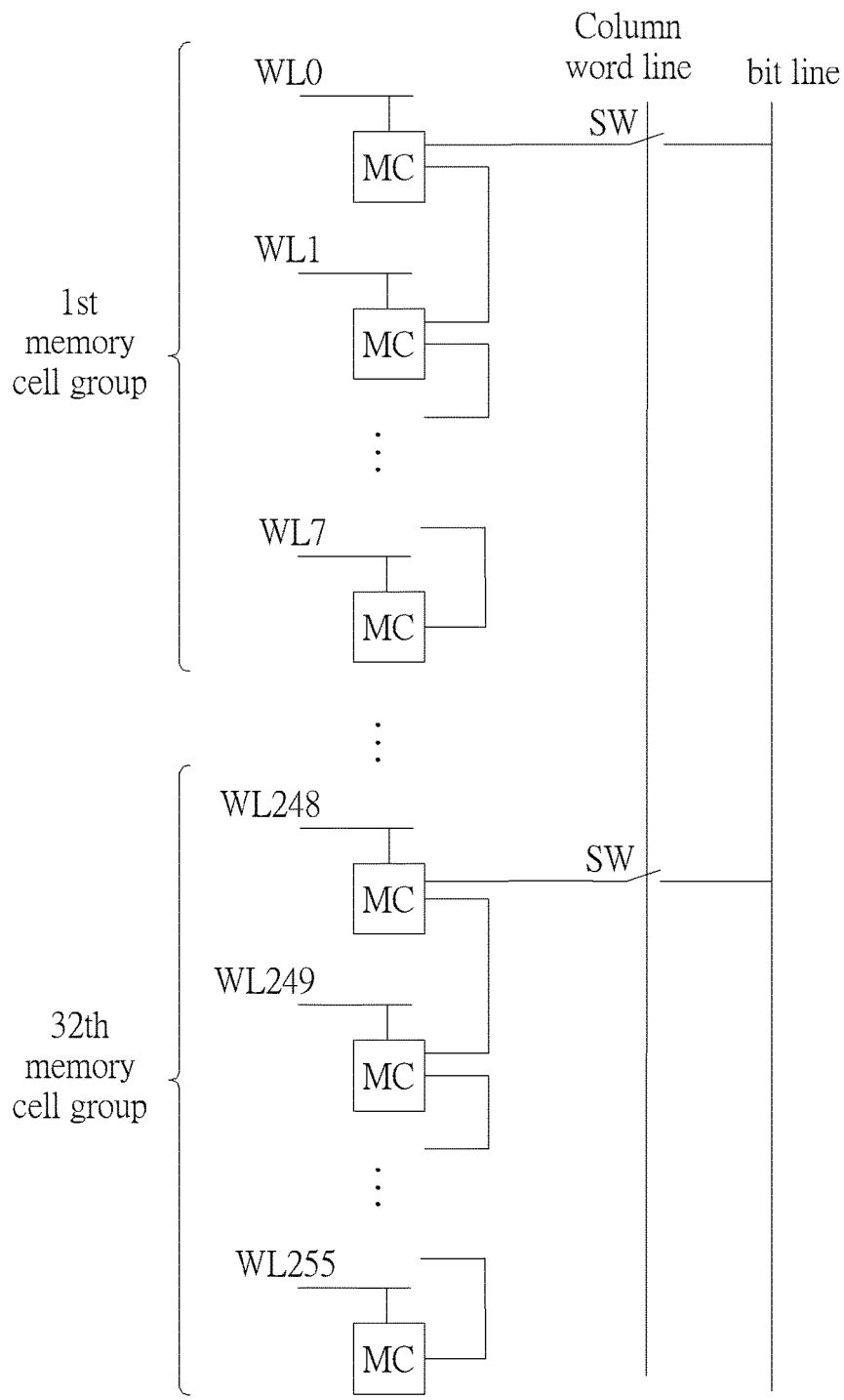
FIG. 8 is a diagram showing a memory unit with a second embodiment of the second word line arrangement of the present invention.

Please refer to FIG. 8. FIG. 8 is a diagram showing a memory unit with a second embodiment of the second word line arrangement of the present invention. Different from the embodiment of FIG. 7, the memory cells MC of each memory cell group of FIG. 8 are coupled in series (such as memory cells of a flash memory device). The column word line is configured to turn on/off 32 switches SW of each column of the memory cells MC of a corresponding memory block simultaneously. Similarly, the second word line arrangement of FIG. 8 is also applicable to the memory device 400a of FIG. 5 and the memory device 500a of FIG. 6.

In the embodiments of FIG. 7 and FIG. 8, each of the memory cell group comprises 8 memory cells, but the present invention is not limited to it. In other embodiments of the present invention, each of the memory cell group can comprises other number of memory cells according to design requirements.

Comparing with the first word line arrangement of FIG. 4, the second word line arrangements of FIG. 7 and FIG. 8 comprise fewer switches, in order to reduce overall area of the memory devices.

In addition, for the memory devices 400a and 500a, when the memory block bkx among the memory blocks bk0-bk7 is selected, the column word line CWLx would be turned on, e.g., the column word line CWLx may carry a high voltage, thereby the switches SW corresponding to the memory block bkx, i.e., the switches connecting the column word line CWLx and controlled to be conducted or cut off by the column word line CWLx, are conducted. At the same time, the switches SW within the rest memory blocks, e.g., the memory blocks bk0-bk(x−1) and bk(x+1)-bk7 within the memory device 400a/500a, are cutoff.

Figure 24:
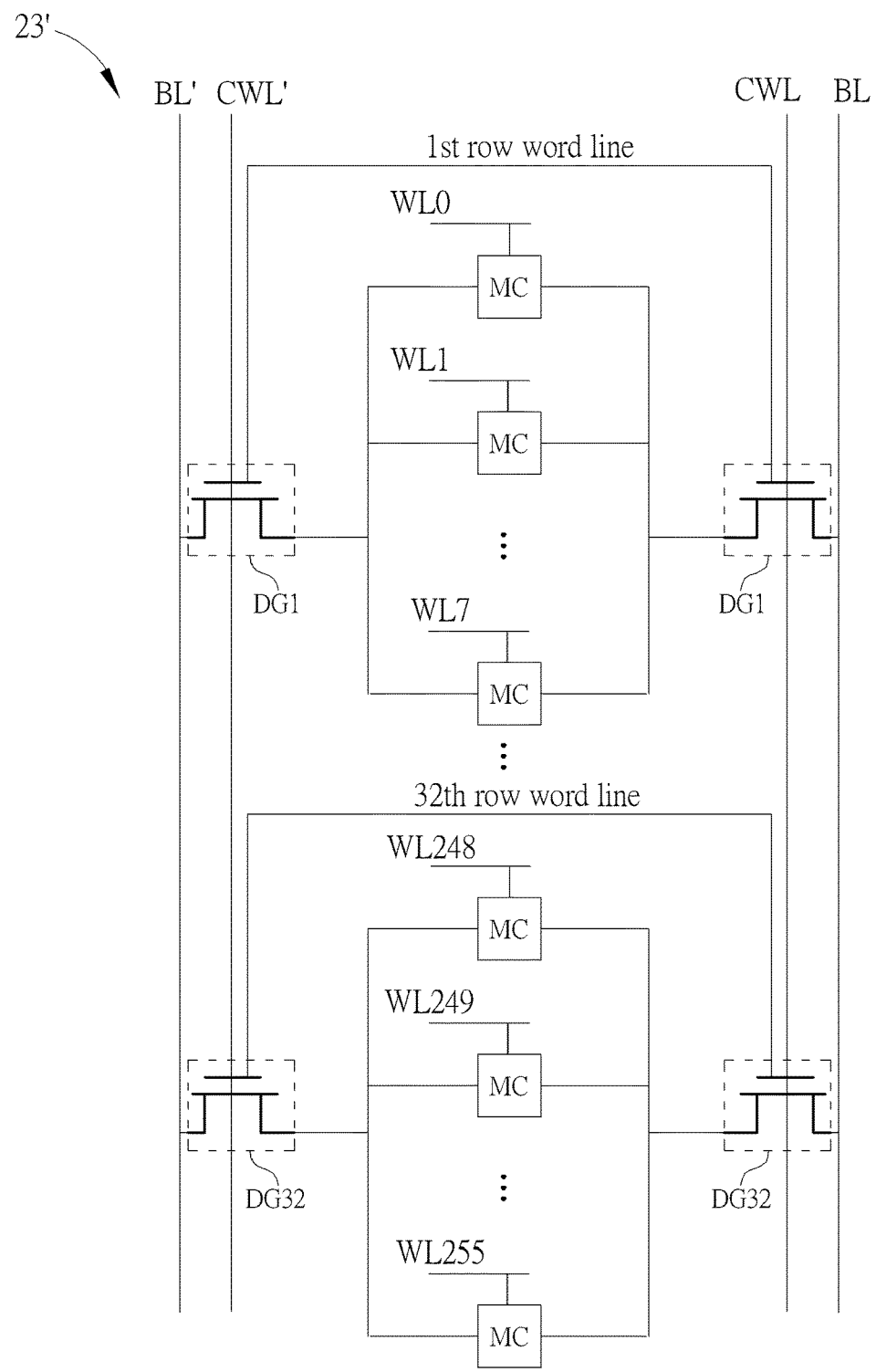
FIG. 24 is a diagram showing a memory unit in the first embodiment of the fourth word line arrangement of the present invention.
Figure 25:
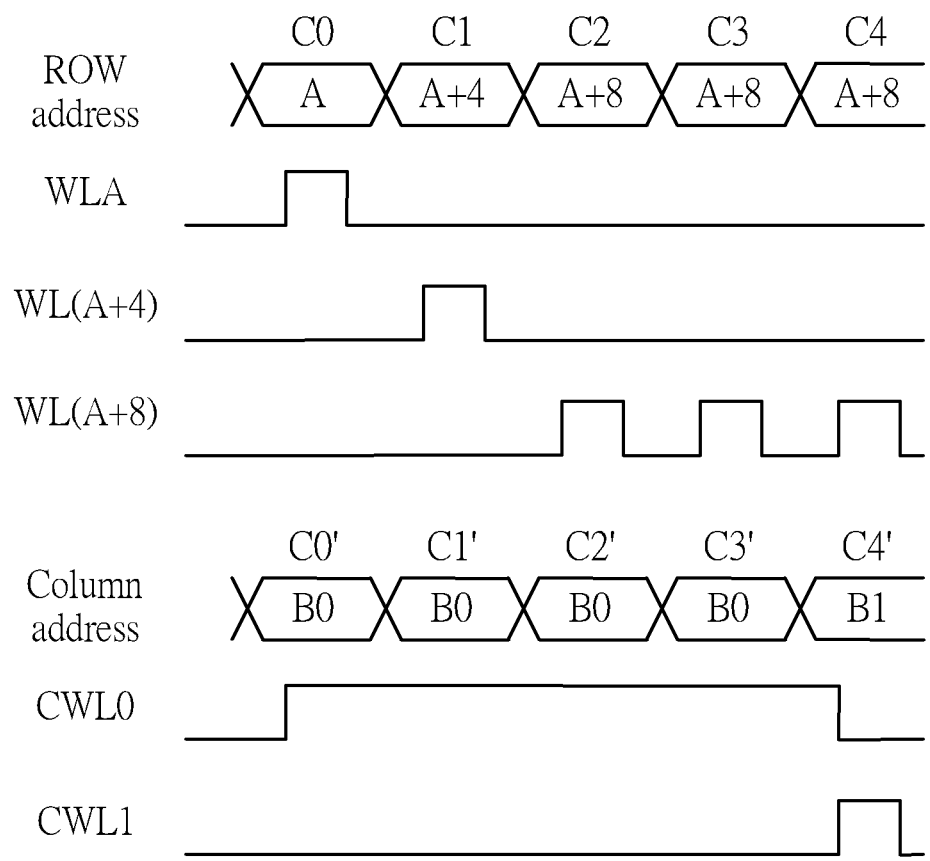
FIG. 25 illustrates word line signals and column word line signals of the present invention.

Please refer to FIG. 25, which illustrates word line signals WLA, WL(A+4), WL(A+8) and column word line signals CWL0 and CWL1. Notations WLA, WL(A+4), WL(A+8), CWL0 and CWL1 are used to denote word line signals and word lines interchangeably. As can be seen from FIG. 24, the column word line signals CWL0 and CWL1 transit (from high to low or from low to high) less frequently than the word line signals WLA, WL(A+4), WL(A+8).

Notably, in the prior art, the word line signal would transit from low to high and from high to low every memory cycle, regardless whether the word line is consecutively selected. In other words, even the word line is consecutively selected, the word line still transits its status, i.e., from low to high and from high to low, on each of the consecutive memory cycles. For example, in FIG. 25, even the word line (A+8) is selected during the consecutive memory cycles C2, C3 and C4, the word line signal (A+8) transits from low to high and from high to low on each of the consecutive memory cycles C2, C3 and C4.

On the other hand, in the present invention, when the memory block bk0, for example, is selected over the consecutive memory cycles C0', C1', C2' and C3', the control circuit CC generates the column word line signal CWL0 retaining at a first voltage level (e.g., a high voltage) during the consecutive cycles C0', C1', C2' and C3', such that the switches within the memory block bk0 would remain conducted during the consecutive memory cycles C0', C1', C2' and C3'. The switches within the rest memory blocks, e.g., bk1-bk7, are cutoff.

In this case, transitions on the column word line signals CWL0-CWL7 would be much less frequently than transitions on the word line signals WL0-CWL255. Thereby, the power consumption is reduced.

Figure 9:
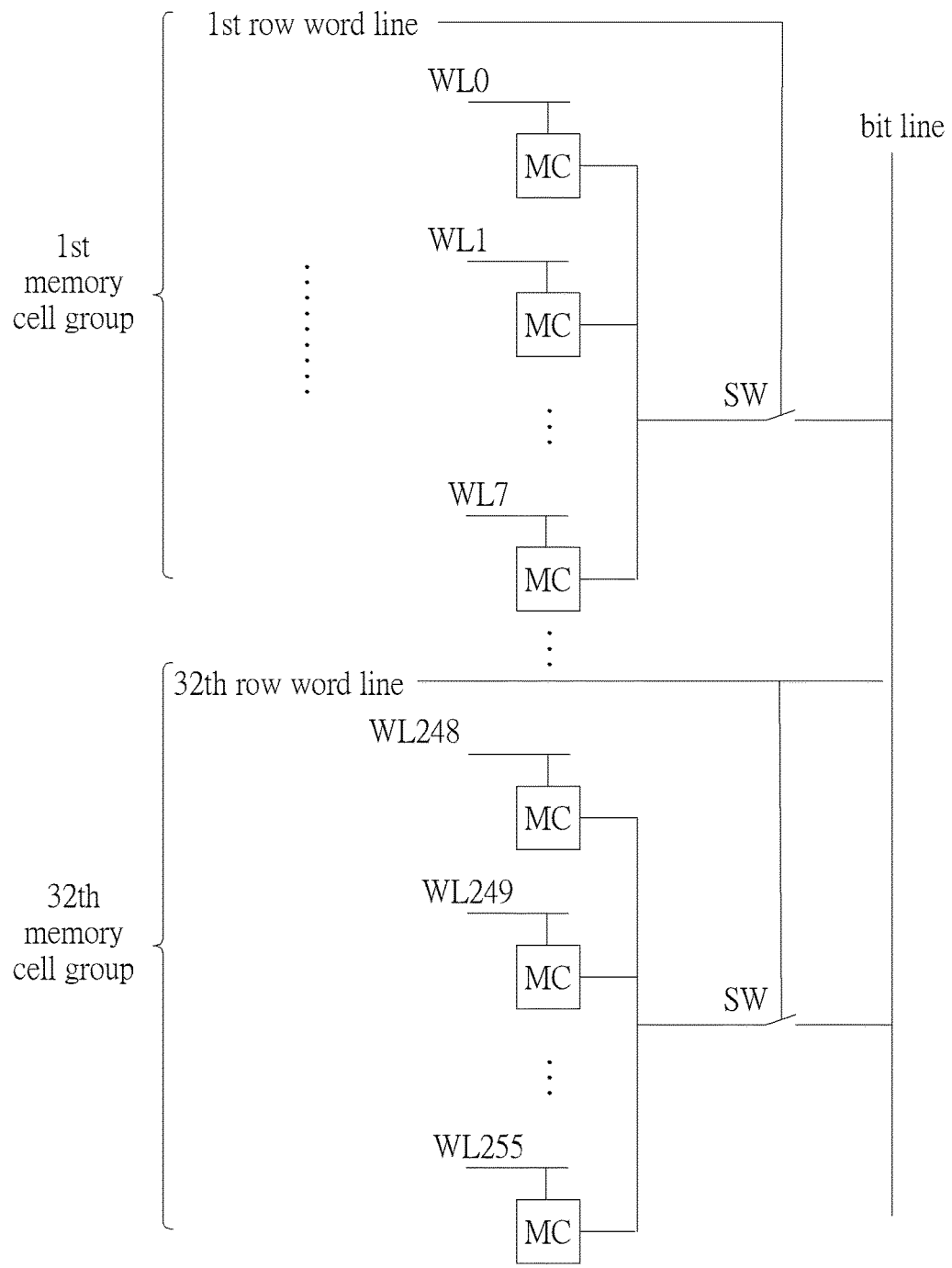
FIG. 9 is a diagram showing a memory unit with a first embodiment of a third word line arrangement of the present invention.
Figure 11:
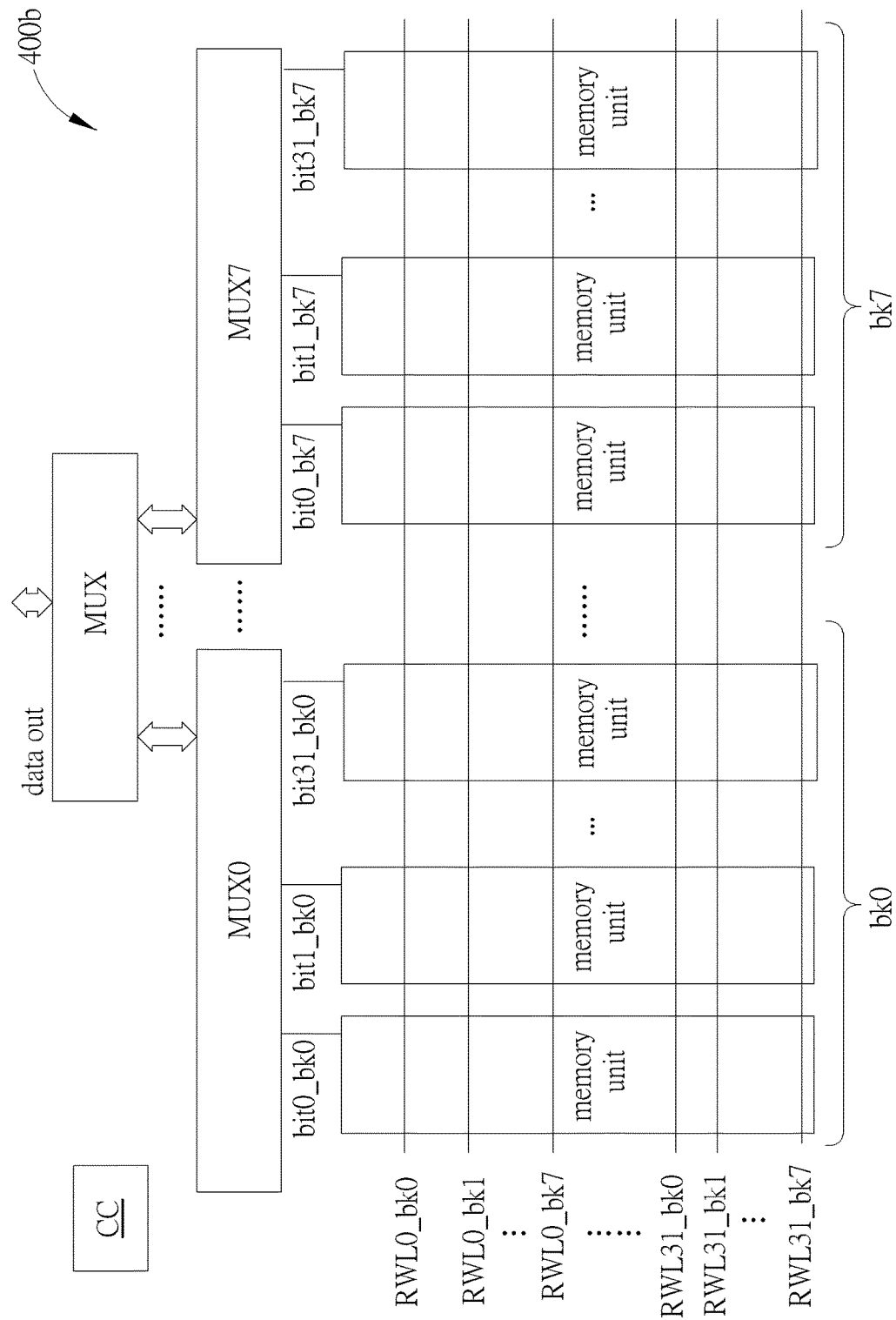
FIG. 11 is a diagram showing a memory device of the present invention with the third word line arrangement and the first bit line arrangement.
Figure 12:
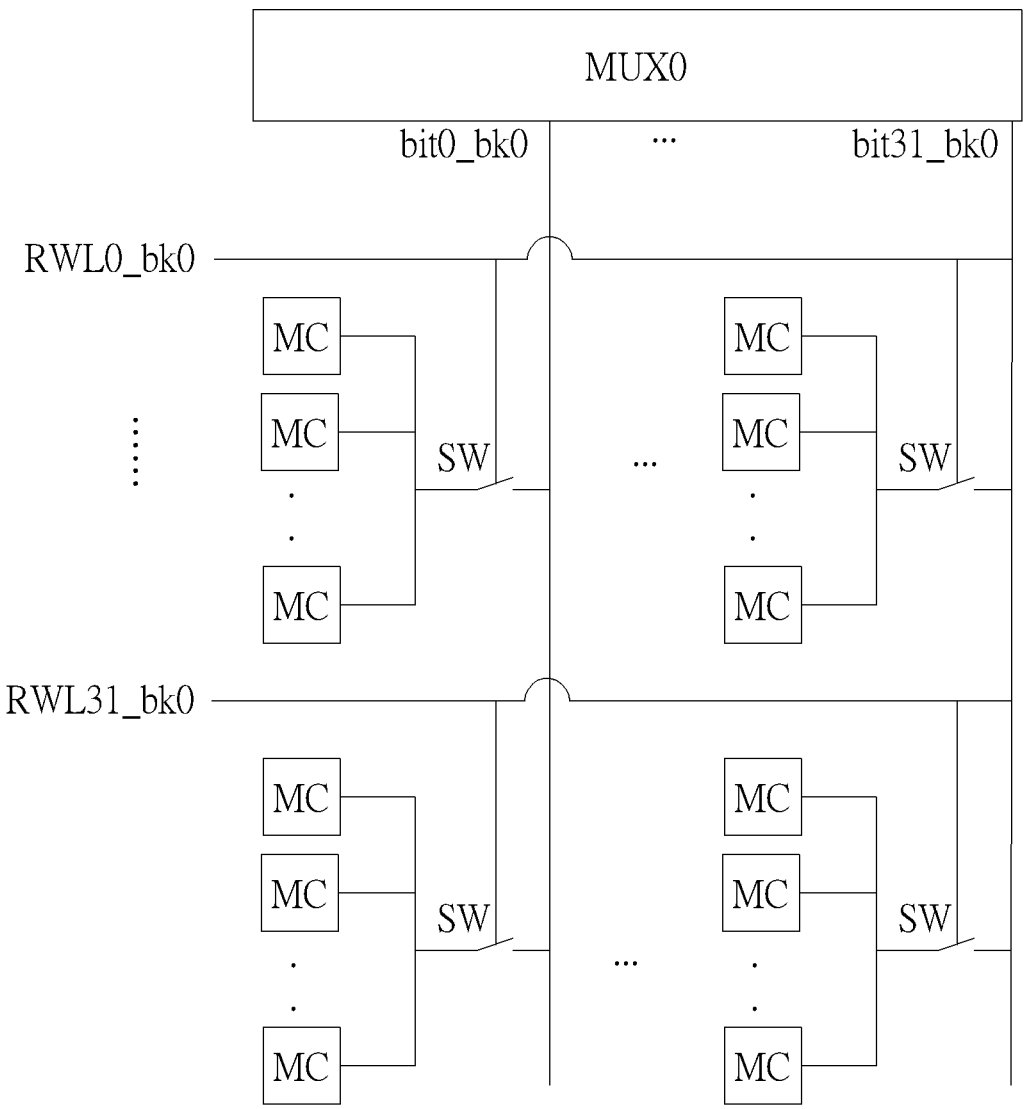
FIG. 12 is a diagram showing a portion of the memory device of FIG. 11.

Please refer to FIG. 9 and FIGS. 11-12 together. FIG. 9 is a diagram showing a memory unit with a first embodiment of a third word line arrangement of the present invention. FIG. 11 is a diagram showing a memory device 400b of the present invention with the third word line arrangement and the first bit line arrangement. FIG. 12 is a diagram showing a portion of the memory device 400b of FIG. 11. For ease of illustration, a column of the memory cells MC and related signal lines/switches are represented by a memory unit in FIG. 11, and word lines are omitted in FIGS. 11 and 12. As shown in figures, a column of the memory cells MC are divided into a predetermined number (such as 32) of memory cell groups, and each of the 32 memory cell groups comprises 8 memory cells. The switch SW is coupled between one of the 32 memory cell groups and a corresponding bit line. The memory device 400b comprises a plurality of row word lines (RWL0_bk0 to RWL31_bk7) elongated along the first direction A, and each of the row word lines (RWL0_bk0 to RWL31_bk7) is configured to turn on/off one of 32 switches SW of each column of the memory cells MC of a corresponding memory block. For example, the row word line RWL0_bk0 is coupled to the control terminal of the switch SW corresponding to the first memory cell group of each column of the memory block bk0, the row word line RWL31_bk0 is coupled to the control terminal of the switch SW corresponding to the 32th memory cell group of each column of the memory block bk0, and so on. As such, the row word lines (RWL0_bk0 to RWL31_bk7) can further select a specific memory cell group of each column of the memory cells MC of a corresponding memory block bk0-bk7 for transmitting data.

In addition, the memory device 400b also comprises the control circuit CC to generate the row word line signals RWL0_bk0-RWL31_bk7, where notations RWL0_bk0-RWL31_bk7 are used to denote row word line signals and row word lines interchangeably.

Similarly, when the k-th memory cell group within the memory unit illustrated in FIG. 9 is selected over a plurality of consecutive cycles, the control circuit CC would generate the k-th row word line signal retaining at a first voltage level during the plurality of consecutive cycles, such that the switch SW in FIG. 9 corresponding to the k-th memory cell group, controlled by the k-th row word line signal would remain conducted during the plurality of consecutive cycles, and the rest switches SW corresponding to the rest memory cell groups within the memory unit illustrated in FIG. 9 are cutoff.

Figure 13:
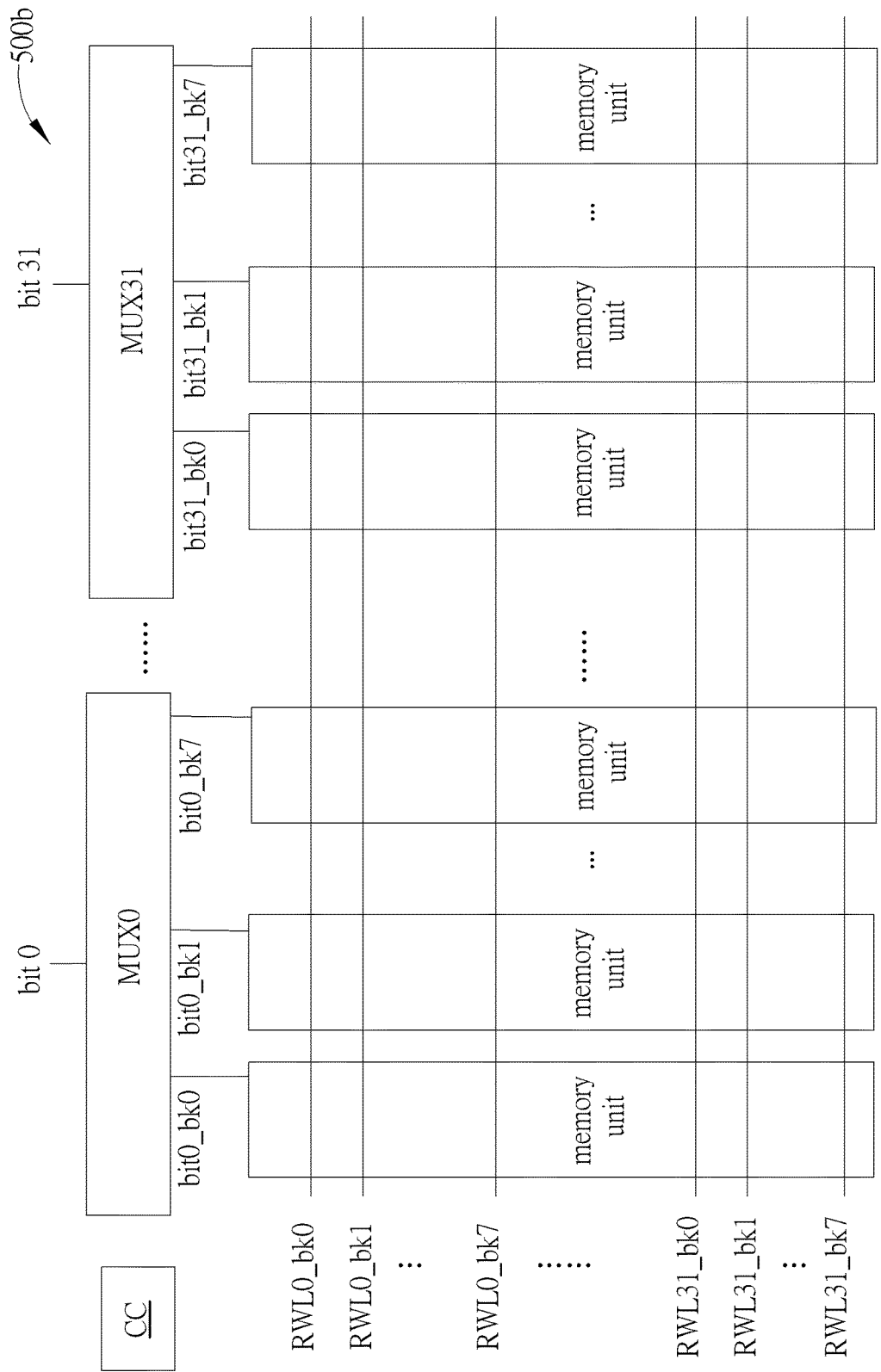
FIG. 13 is a diagram showing a memory device of the present invention with the third word line arrangement and the second bit line arrangement.
Figure 14:
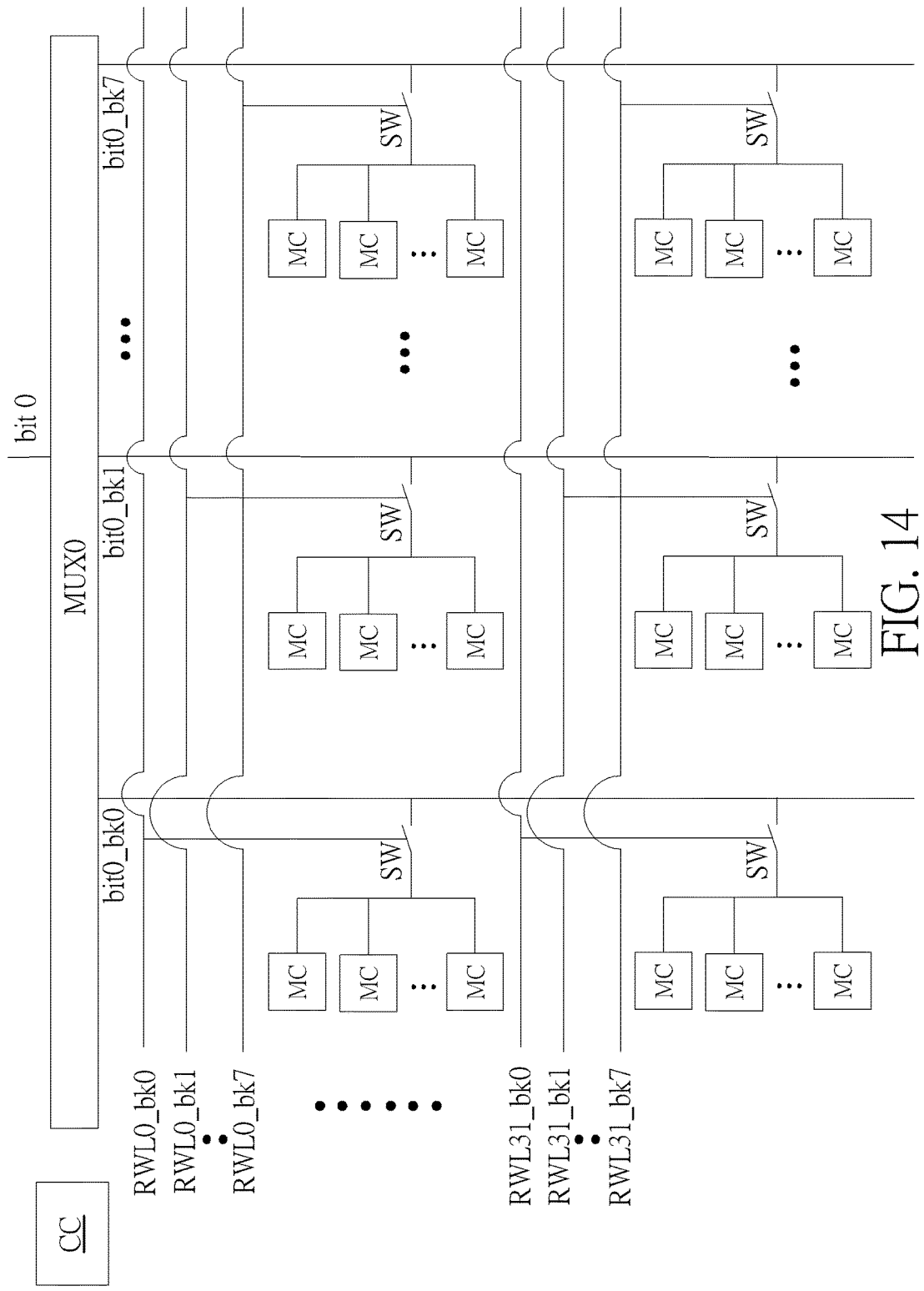
FIG. 14 is a diagram showing a portion of the memory device of FIG. 13.

Please refer to FIG. 9 and FIGS. 13-14 together. FIG. 13 is a diagram showing a memory device 500b of the present invention with the third word line arrangement and the second bit line arrangement. FIG. 14 is a diagram showing a portion of the memory device 500b of FIG. 13. For ease of illustration, a column of the memory cells MC and related signal lines/switches are represented by a memory unit in FIG. 13, and word lines are omitted in FIGS. 13 and 14. Although the bit lines (bit0_bk0 to bit31_bk7) of each memory block bk0-bk7 are scattered sequentially, the row word lines (RWL0_bk0 to RWL31_bk7) in FIGS. 13-14 is still configured to turn on/off one of 32 switches SW of each column of the memory cells MC of a corresponding memory block. For example, the row word line RWL0_bk0 is coupled to the control terminal of the switch SW corresponding to the first memory cell group of each column of the memory block bk0, the row word line RWL31_bk0 is coupled to the control terminal of the switch SW corresponding to the 32th memory cell group of each column of the memory block bk0, and so on. As such, the row word lines (RWL0_bk0 to RWL31_bk7) can further select a specific memory cell group of each column of the memory cells MC of a corresponding memory block bk0-bk7 for transmitting data. Similarly, the memory device 500b also comprises the control circuit CC to generate the row word line signals RWL0_bk0-RWL31_bk7

Figure 10:
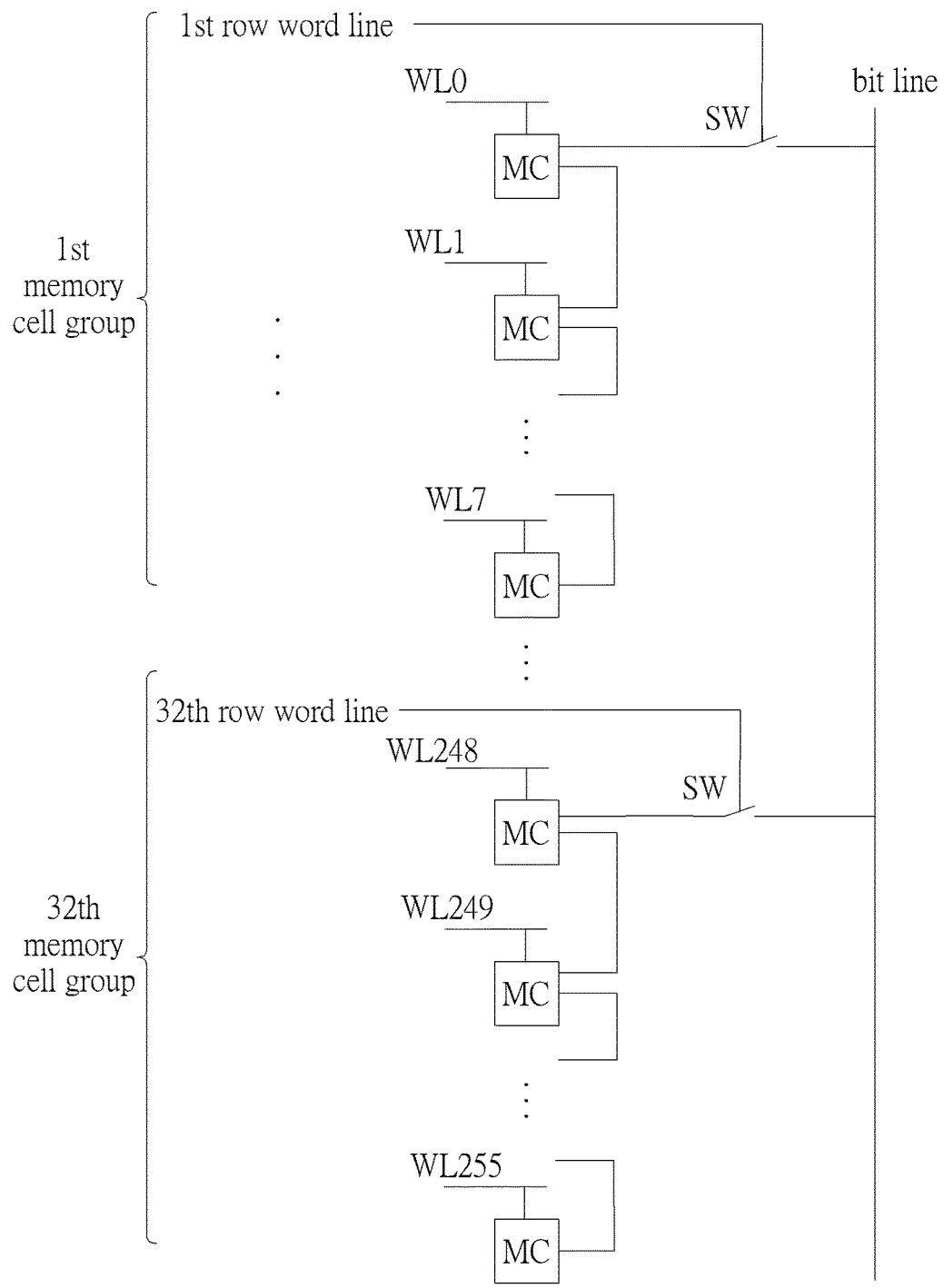
FIG. 10 is a diagram showing a memory unit with a second embodiment of the third word line arrangement of the present invention.

Please refer to FIG. 10. FIG. 10 is a diagram showing a memory unit with a second embodiment of the third word line arrangement of the present invention. Different from the embodiment of FIG. 9, the memory cells MC of each memory cell group of FIG. 10 are coupled in series (such as memory cells of a flash memory device). The row word line is configured to turn on/off one of 32 switches SW of each column of the memory cells MC of a corresponding memory block. Similarly, the third word line arrangement of FIG. 10 is also applicable to the memory device 400b of FIG. 11 and the memory device 500b of FIG. 13.

Comparing with the first word line arrangement and the second word line arrangement, the third word line arrangement only turns on one switch SW of each column of the memory cells MC for transmitting data. Thus the third word line arrangement can further reduce power consumption of the memory device. However, a number of the row word lines (RWL0_bk0 to RWL31_bk7) is a multiple of a number of the column word lines CWL0-CWL7. The third word line arrangement may need to form the plurality of row word lines in different metal layers, but the first word line arrangement and the second word line arrangement can form the plurality of column word lines in a same metal layer. For example, when each of the memory cell group comprises four memory cells, and the memory device comprises 32 memory blocks, there are totally 32 row word lines need to be arranged within a layout area of the four memory cells for passing through. Thus the 32 row word lines must be form in different metal layers. As to the first word line arrangement and the second word line arrangement, only one column word line needs to be arranged within the layout area of the memory cells. Thus the column word lines can be formed in a same metal layer.

Figure 15:
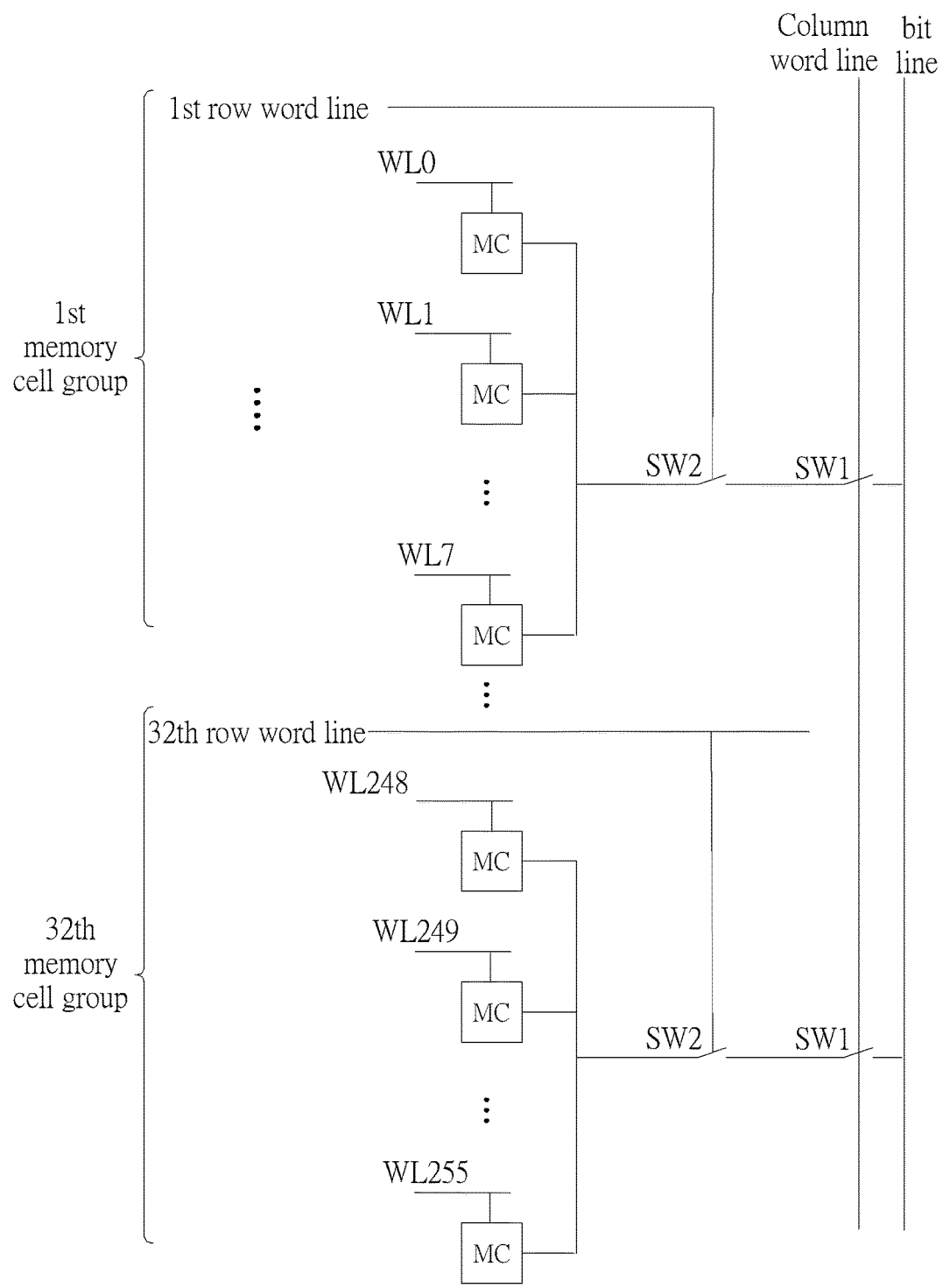
FIG. 15 is a diagram showing a memory unit with a first embodiment of a fourth word line arrangement of the present invention.
Figure 17:
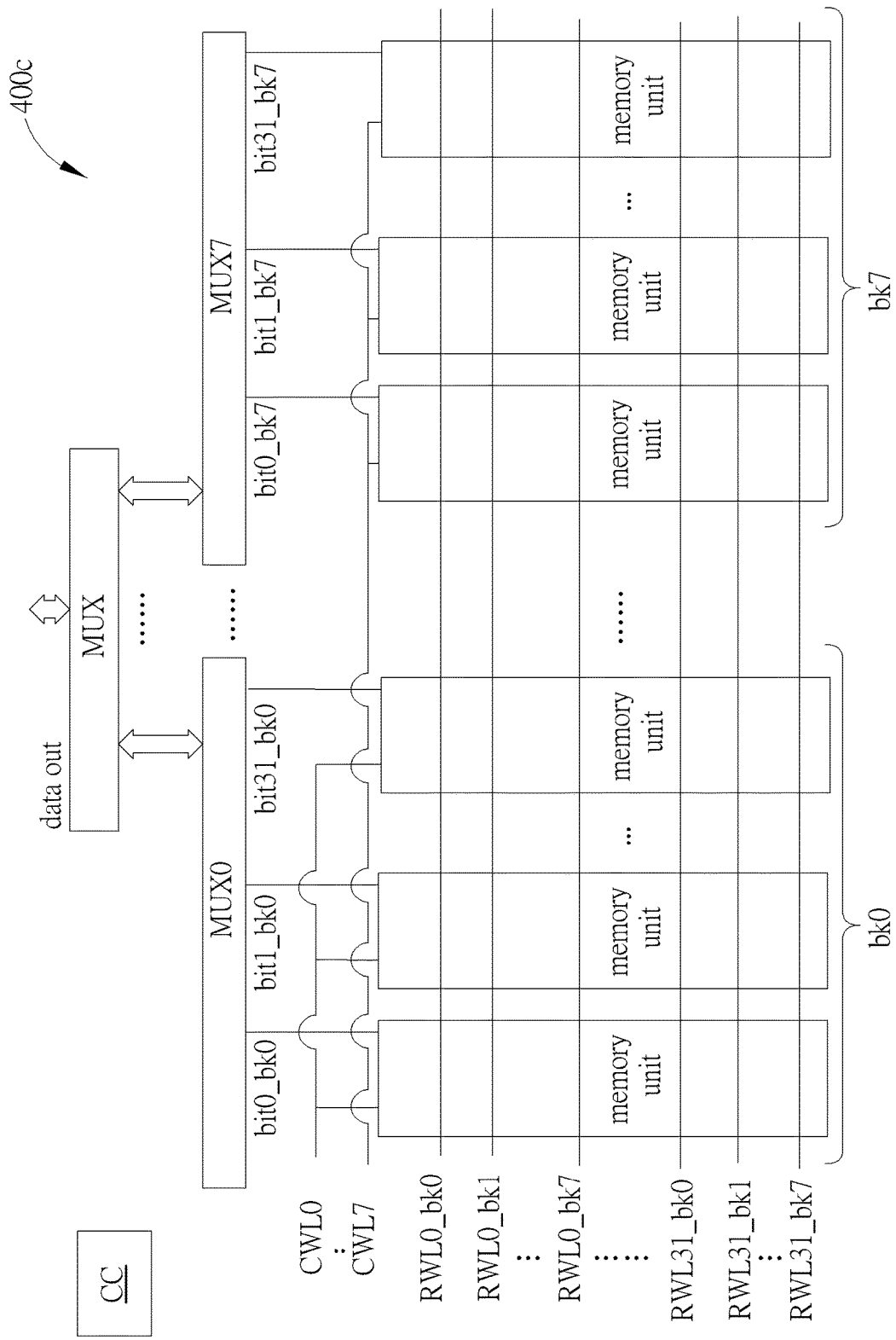
FIG. 17 is a diagram showing a memory device of the present invention with the fourth word line arrangement and the first bit line arrangement.

Please refer to FIG. 15 and FIG. 17 together. FIG. 15 is a diagram showing a memory unit with a first embodiment of a fourth word line arrangement of the present invention. FIG. 17 is a diagram showing a memory device 400c of the present invention with the fourth word line arrangement and the first bit line arrangement. For ease of illustration, a column of the memory cells MC and related signal lines/switches are represented by a memory unit, and word lines are omitted in FIG. 17. As shown in figures, the memory device 400c comprises a plurality of column switches SW1 and a plurality of row switches SW2. The column switch SW1 is controlled by the corresponding column word line CWL0-CWL7. The row switch SW2 is controlled by the corresponding row word line (RWL0_bk0 to RWL31_bk7). The column switch SW1 of FIG. 15 operates similarly to the switch SW of FIG. 7, and the row switch SW2 operates similarly to the switch SW of FIG. 9. The electrical connection of the row word lines (RWL0_bk0 to RWL31_bk7) of FIG. 17 is similar to that of FIG. 12. The column switch SW1 and the row switch SW2 are coupled between one of the memory cell groups and a corresponding bit line in series (bit0_bk0 to bit31_bk7). The memory cells MC can be selected by the corresponding word line, column word line CWL0-CWL7, row word line (RWL0_bk0 to RWL31_bk7).

According to the above arrangement, the memory device 400c can also reduce power consumption. Moreover, the memory device 400c can operate in two modes. For example, when the column word lines are configured to turn on all the column switches SW1 in default, the memory device 400c can operate similarly to the memory device 400b; and when branches of column word lines, which extend to the memory units, of each memory block are further grouped into four groups to respectively control eight columns of memory cells to work individually, the memory device 400c can operate in a byte enable mode for outputting data in byte format.

Figure 20:
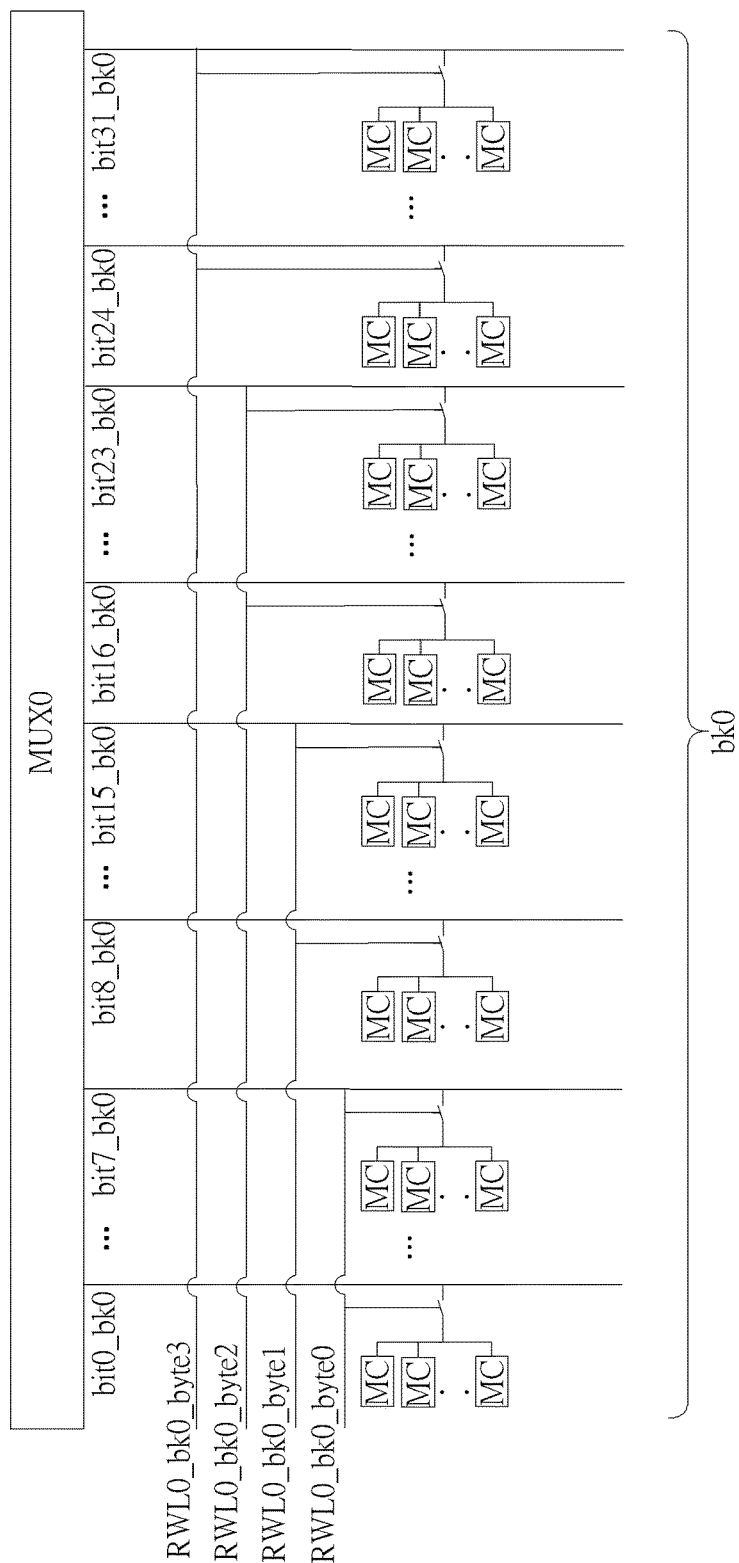
FIGS. 20-22 are diagrams showing examples of the memory device of the present invention configured to operate in a byte enable mode.
Figure 21:
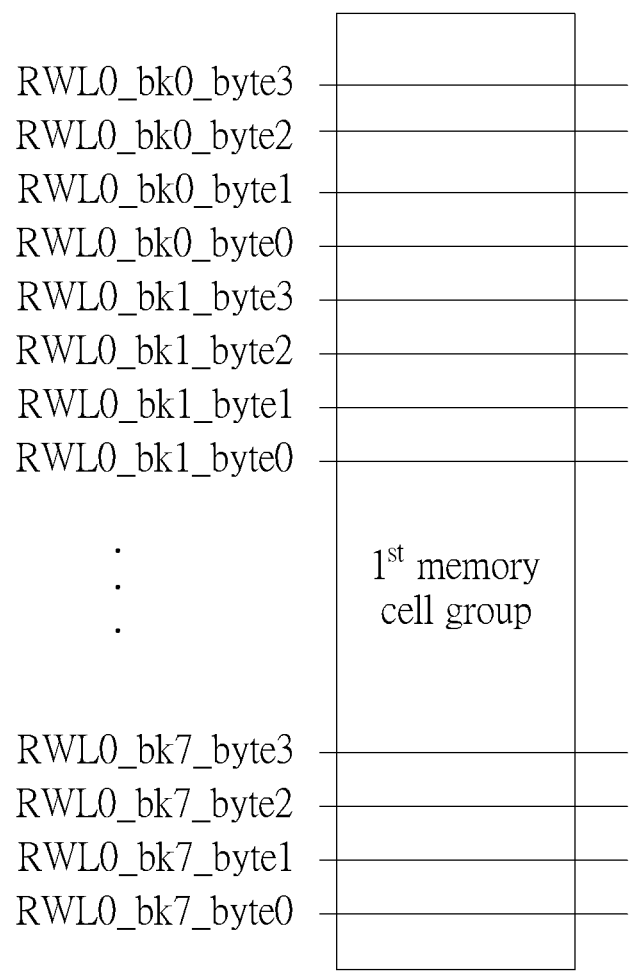
Figure 22:
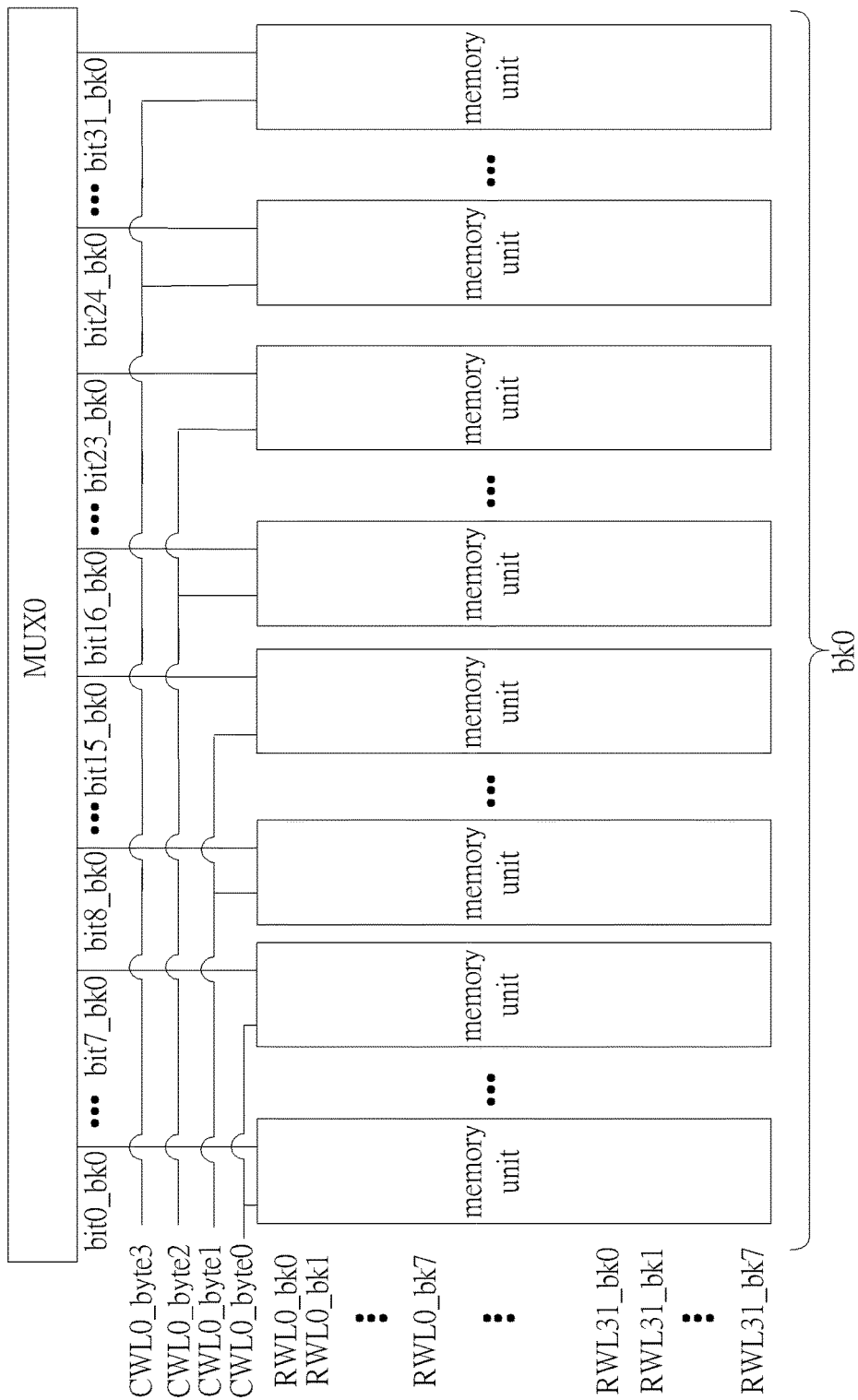

When the third word line arrangement in FIG. 11 is further configured to operate in a byte enable mode, the number of the row word line of a memory block needs to be multiplied by four for respectively controlling eight columns of memory cells to work individually. For example, as shown in FIG. 20, each of four row word lines (RWL0_bk0_byte0 to RWL0_bk0_byte3) of the memory block bk0 is arranged to control eight columns of memory cells of the first memory cell groups to work individually. In other words, there are totally 32 row word lines need to be arranged within a layout area of the eight memory cells of a memory cell group for passing through, where the fourth word line arrangement needs only eight row word lines to be arranged within the layout area of the eight memory cells of a memory cell group for passing through. Thus the third word line arrangement must form the 32 row word lines in different metal layers, but the fourth word line arrangement can form the eight row word lines in a same metal layer. For example, as shown in FIG. 21, for controlling the first memory cell groups of the eight memory blocks of the third word line arrangement to operate in the byte enable mode, the row word lines (RWL0_bk0_byte0 to RWL0_bk7_byte3) corresponding to the first memory cell groups of the eight memory blocks are all arranged to pass through each of the first memory cell groups. However, as shown in FIG. 22, branches of column word lines of the memory block bk0 are grouped into four column word lines (CWL0_byte0 to CWL0_byte 3) to respectively control eight columns of memory cells to operate in the byte enable mode, and the number of the row word lines (RWL0_bk0 to RWL31_bk7) of the fourth word line arrangement remains the same. As mentioned above, the fourth word line arrangement of the memory device 400c can operate similarly to the third word line arrangement of the memory device 400b, thus the power consumption of the memory device 400c and the memory device 400b are almost the same. Therefore, the fourth word line arrangement has both the advantages of the first/second word line arrangement and the third word line arrangement.

Figure 18:
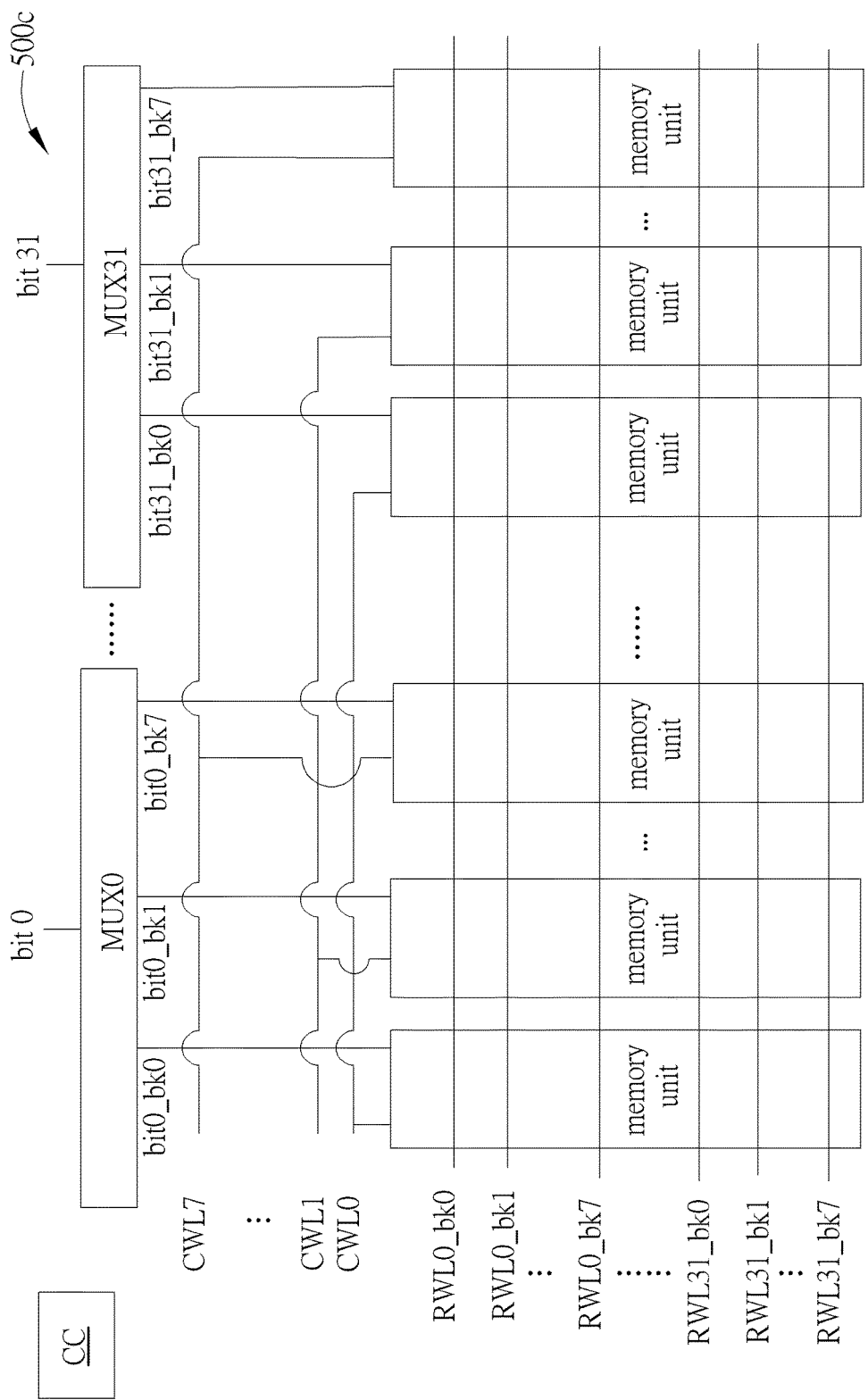
FIG. 18 is a diagram showing a memory device of the present invention with the fourth word line arrangement and the second bit line arrangement.

Please refer to FIG. 15 and FIG. 18 together. FIG. 18 is a diagram showing a memory device 500c of the present invention with the fourth word line arrangement and the second bit line arrangement. For ease of illustration, a column of the memory cells MC and related signal lines/switches are represented by a memory unit, and word lines are omitted in FIG. 18. The electrical connection of the row word lines (RWL0_bk0 to RWL31_bk7) of FIG. 18 is similar to that of FIG. 14. Although the bit lines (bit0_bk0 to bit31_bk7) of each memory block bk0-bk7 are scattered sequentially, the column word lines CWL0-CWL7, the row word lines (RWL0_bk0 to RWL31_bk7), the column switches SW1 and the row switches SW2 of FIG. 18 still operate similarly to those of FIG. 17. Therefore, no further illustration is provided.

Figure 16:
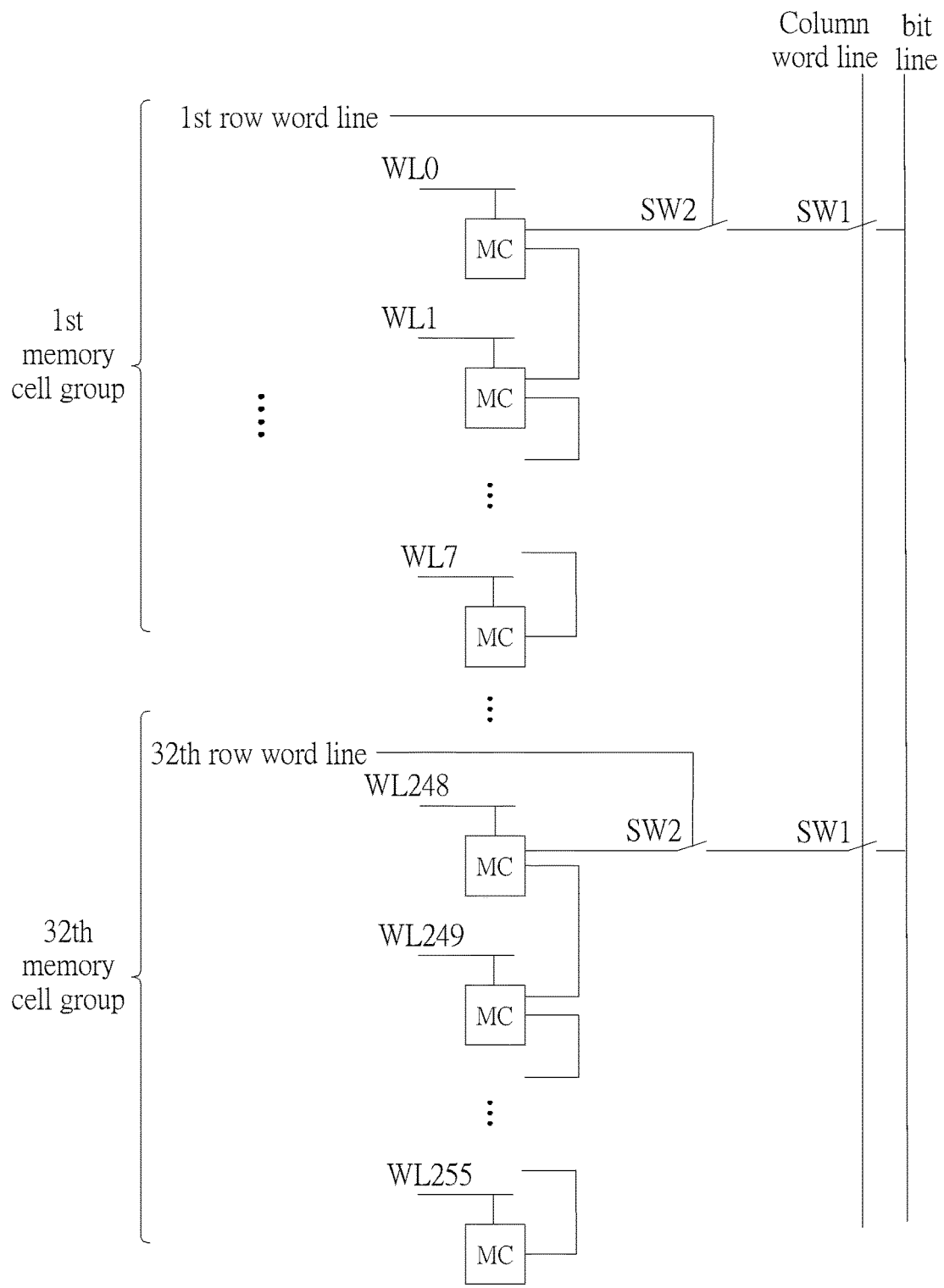
FIG. 16 is a diagram showing a memory unit with a second embodiment of the fourth word line arrangement of the present invention.

In addition, the row word lines within the memory unit illustrated in FIGS. 15 and 16 do not have to be grouped. The row word lines within the memory unit illustrated in FIGS. 15 and 16 can be the row word lines (RWL0_bk0 to RWL31_bk7) illustrated in FIGS. 17 and 18. The number of row word lines is not limited. For example, the memory device 400c in FIG. 17 and the memory device 500c in FIG. 18 may only require 32 row word lines.

Please refer to FIG. 16. FIG. 16 is a diagram showing a memory unit with a second embodiment of the fourth word line arrangement of the present invention. Different from the embodiment of FIG. 15, the memory cells MC of each memory cell group of FIG. 16 are coupled in series (such as memory cells of a flash memory device). Similarly, the fourth word line arrangement of FIG. 16 is also applicable to the memory device 400c of FIG. 17 and the memory device 500c of FIG. 18.

Figure 19:
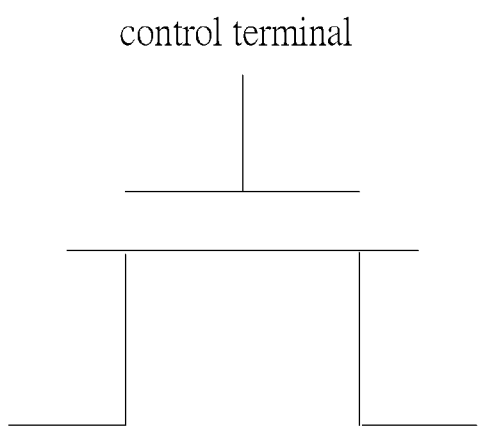
FIG. 19 is a diagram showing an embodiment of a switch of the memory device of the present invention.

Please refer to FIG. 19. FIG. 19 is a diagram showing an embodiment of a switch of the memory device of the present invention. As shown in figures, the aforementioned switches SW, SW1, SW2 can be transistors, but the present invention is not limited to it. The switches SW, SW1, SW2 can be other type of switch element for controlling electrical connections between the memory cells and the bit lines.

Figure 23:
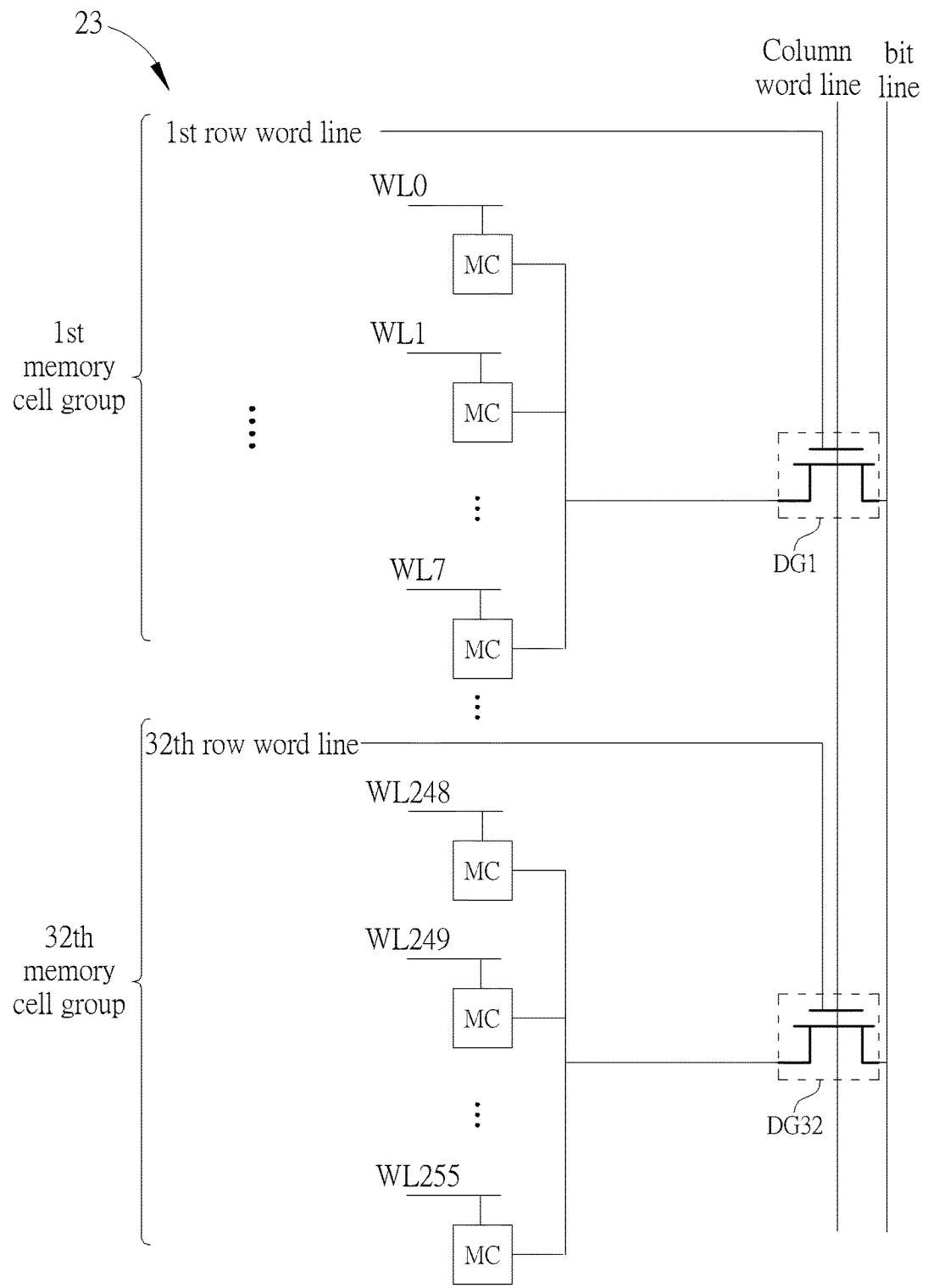
FIG. 23 is a diagram showing a memory unit in the first embodiment of the fourth word line arrangement of the present invention.

Please refer to FIG. 23. FIG. 23 is a diagram showing a memory unit 23 in the first embodiment of the fourth word line arrangement, the same as which in FIG. 15, which may be applied in the memory device 400c in FIG. 17 or the memory device 500c in FIG. 18. The memory unit 23 is an alteration of the memory unit illustrated in FIG. 15. Different from the one illustrated in FIG. 15, the memory unit 23 comprises double-gate transistors DG1-DG32. The double-gate transistor DGx, replacing the column switch SW1 and the row switch SW2 in FIG. 15, is coupled between the memory cells forming the x-th memory cell group and the bit line. The double-gate transistor DGx is controlled by both the column word line corresponding to the memory unit 23 and also the x-th row word line.

When a memory block bky among the memory blocks bk0-bk7 within the memory device 400c is selected, the double-gate transistors within the rest memory blocks bk0-bk(y−1) and bk(y+1)-bk7 within the memory device 400c/500c are cutoff. In addition, when the x-th memory cell group within the memory unit 23 within the memory block bky is selected, the double-gate transistor DGx is conducted, and the rest switches DG1-DG(x−1) and DG(x+1)-DG32 are cutoff.

Please refer to FIG. 24. FIG. 24 is a diagram showing a memory unit 23' in the first embodiment of the fourth word line arrangement. The memory unit 23' is an alteration of the memory unit 23. Different from the memory unit 23, the memory cells within the memory unit 23' is connected to the bit lines BL0, BL0' and the column word lines CWL, CWL'. In an embodiment, the column word lines CWL and CWL' may be realized by the same line, allowing the memory cell read and written in both sides, so as to save power and be easy to layout. In an embodiment, the memory cell MC within the memory unit 23' may be realized by an SRAM 6T memory cell. Details of the memory unit 23' are either the same as the memory unit 23 or known by those skilled in the art, which is not narrated herein for brevity.

Figure 26:
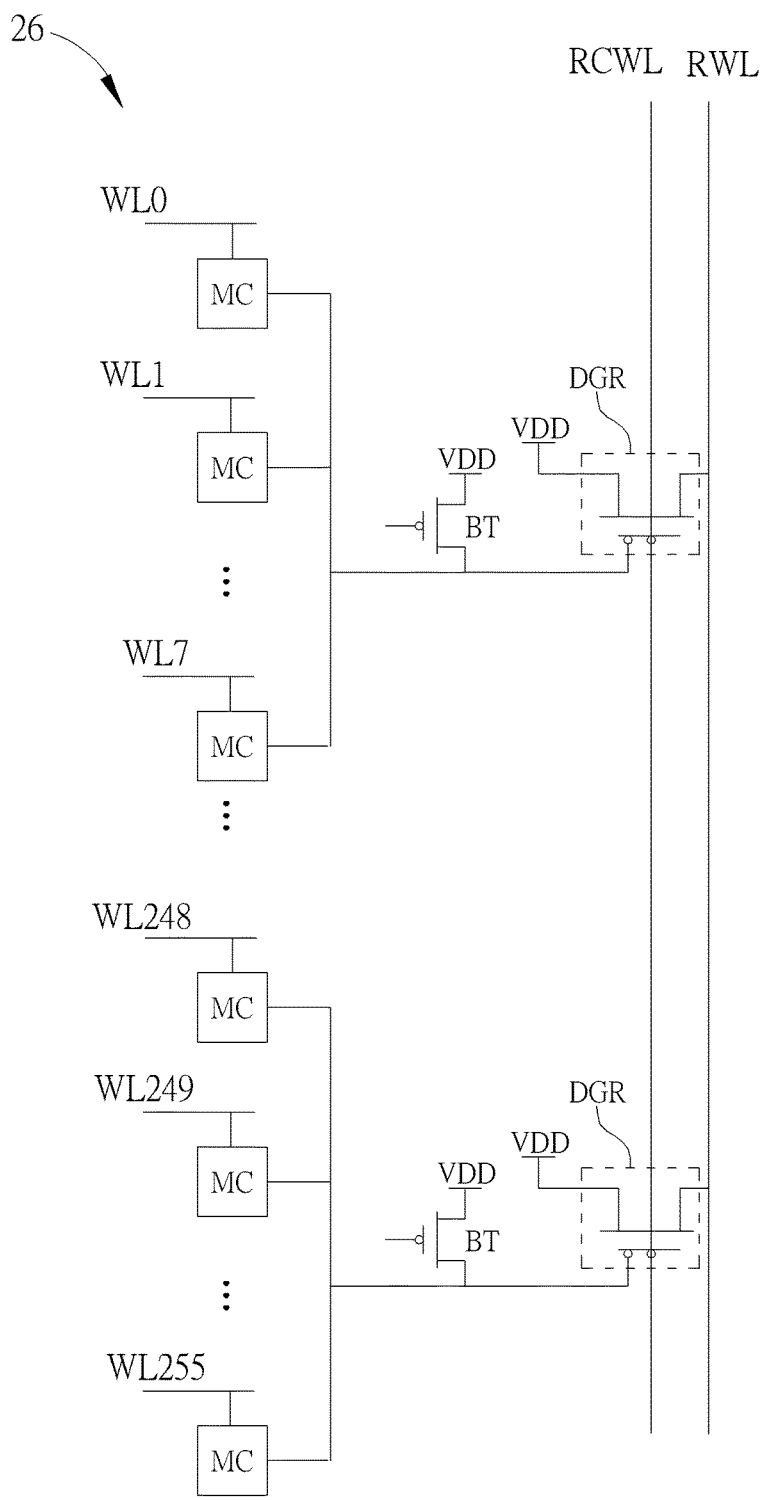
FIG. 26 is a diagram showing a memory unit with the first embodiment of the second word line arrangement of the present invention.

Please refer to FIG. 26. FIG. 26 is a diagram showing a memory unit 26 with the first embodiment of the second word line arrangement, the same as which in FIG. 7, of the present invention. The memory unit 26 is an alteration of the memory unit illustrated in FIG. 7. Different from the one illustrated in FIG. 7, the memory unit 26 comprises double-gate transistors DGR and biasing transistors BT. The double-gate transistor DGR comprises a first terminal, a second terminal, a first gate and a second gate. The first terminal is coupled to a read bit line RBL. The second terminal receives a reference voltage VDD. The first gate is coupled to a read column word line RCWL. The second gate is couple to one of the memory cell group. The biasing transistor BT is coupled between the double-gate transistor DGR and one of the memory cell group. Similarly, when the memory cell group is selected, the double-gate transistor DGR corresponding to the selected memory cell group is conducted. Otherwise, the double-gate transistors DGR corresponding to the non-selected memory cell groups are cutoff. In addition, when the read bit line RBL is required to be pre-charged to the voltage, the biasing transistor BT is conducted. Otherwise, when the memory cell is selected to be read, the biasing transistor BT is cutoff, and the data/voltage stored in the memory cell is outputted to the read bit line RBL. In short, the memory unit 26 is able to enhance read operation of the memory device.

In the above embodiments, the memory cells MC are arranged into a matrix having 256 rows and 256 columns, the plurality of memory cells are divided into 8 memory blocks bk0-bk7, each of the 8 memory blocks bk0-bk7 comprises 32 columns of the memory cells MC, and each memory cell group comprises 8 memory cells. However, the present invention is not limited to the above embodiment. In other embodiment of the present invention, the numbers of rows and columns of the matrix, the number of the memory blocks in the memory device, the number of columns of the memory cells in the memory block, and the number of the memory cells in the memory cell group can be different from the above numbers and determined according to design requirements.

In contrast to the prior art, the memory device of the present invention comprises the column word lines and/or the row word lines for further selecting specific memory cells to be coupled to corresponding bit lines, such that other bit lines corresponding to the unselected memory cells are not driven to transmit data. Therefore, the memory device of the present invention has lower power consumption.

In addition, in the present invention, the non-selected memory block would not perform (dis)charge on the bit line(s). Pre-charge is only performed at the selected memory block before the read operation. Compared to prior art, (dis)charge is performed every time the memory performs the read/write operation, which is to prevent the memory from being unintentionally written.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
a plurality of word lines, elongated along a first direction;
a plurality of bit lines, elongated along a second direction;
a plurality of column word lines, elongated along the second direction;
a control circuit, coupled to the plurality of column word lines, configured to generate a plurality of column word line signals; and
a plurality of memory blocks, each comprising:
a plurality of memory units, each comprising:
a plurality of memory cells; and
a plurality of switches, coupled between the plurality of memory cells and a bit line among the plurality of bit lines;
wherein a first memory block among the plurality of memory blocks is coupled to a plurality of first column word lines among the plurality of column word lines, and the plurality of first column word lines receives a first column word line signal among the plurality of column word line signals;
wherein each of the memory cells within a memory unit within the first memory block is coupled to a first column word line among the plurality of first column word lines;
wherein each of the memory units comprises:
a plurality of second switches, controlled to be conducted or cutoff by a column word line among the plurality of column word lines;
wherein each of the second switches is coupled between a plurality of first memory cells among the plurality of memory cells and the bit line;
wherein a number of the plurality of second switches within the memory unit is less than a number of the plurality of memory cells within the memory unit;
wherein each of the memory units further comprises a plurality of row word lines, elongated along the first direction;
wherein each of the second switches is a double-gate transistor, and controlled to be conducted or cutoff by both the column word line and a row word line among the plurality of row word lines.

2. The memory device of claim 1, wherein each of the memory units comprises:
a plurality of third switches, controlled to be conducted or cutoff by the plurality of row word lines;
wherein each of the third switches is coupled between a plurality of second memory cells among the plurality of memory cells and the bit line.

3. The memory device of claim 1, wherein each of the second switches is a double-gate transistor comprising a first terminal, a second terminal, a first gate and a second gate, the first terminal is coupled to a read bit line among the plurality of bit lines, the second terminal receives a reference voltage, the first gate is coupled to a read column word line, and the second gate is couple to the plurality of first memory cells.

4. The memory device of claim 3, wherein each of the memory units further comprises:
a plurality of biasing transistors, each coupled to the double-gate transistor and the plurality of first memory cells.

5. The memory device of claim 1, wherein when the first memory block among the plurality of memory blocks is selected over a plurality of consecutive cycles, the control circuit generates the first column word line signal retaining at a first voltage level during the plurality of consecutive cycles such that the plurality of switches within the first memory block remain conductive during the plurality of consecutive cycles.

6. A memory device, comprising:
a plurality of word lines, elongated along a first direction;
a plurality of bit lines, elongated along a second direction;
a plurality of column word lines, elongated along the second direction;
a control circuit, coupled to the plurality of column word lines, configured to generate a plurality of column word line signals; and
a plurality of memory blocks, each comprising:
a plurality of memory units, each comprising:
a plurality of memory cells; and
a plurality of switches, coupled between the plurality of memory cells and a bit line among the plurality of bit lines;
wherein a first memory block among the plurality of memory blocks is coupled to a plurality of first column word lines among the plurality of column word lines, and the plurality of first column word lines receives a first column word line signal among the plurality of column word line signals;
wherein each of the memory cells within a memory unit within the first memory block is coupled to a first column word line among the plurality of first column word lines;
wherein each of the memory units comprises:
a plurality of first switches, controlled to be conducted or cutoff by a column word line among the plurality of column word lines;
wherein each of the first switches is coupled between a memory cell among the plurality of memory cells and the bit line;
wherein a number of the plurality of first switches within the memory unit is the same as a number of the plurality of memory cells within the memory unit.

7. The memory device of claim 6, wherein when the first memory block among the plurality of memory blocks is selected over a plurality of consecutive cycles, the control circuit generates the first column word line signal retaining at a first voltage level during the plurality of consecutive cycles such that the plurality of switches within the first memory block remain conductive during the plurality of consecutive cycles.

8. A memory device, comprising:
a plurality of word lines elongated along a first direction; and
at least one memory unit comprising:
a plurality of memory cell groups arranged along a second direction different from the first direction, each of the memory cell groups comprising a plurality of memory cells;
at least one bit line elongated along the second direction, and configured to transmit data of a selected memory cell;
at least one column word line elongated along the second direction;
a plurality of row word lines elongated along the first direction;

a plurality of switches, coupled between a bit line of the at least one bit line and the plurality of memory cell groups, wherein each switch is controlled to be conducted or cutoff by both a column word line of the at least one column word line and a row word line among the plurality of row word lines;

wherein each of the plurality of switches is a double-gate transistor.

* * * * *